United States Patent
Kawamura et al.

(10) Patent No.: US 9,880,464 B2
(45) Date of Patent: Jan. 30, 2018

(54) PATTERN FORMING METHOD

(71) Applicant: Toshiba Memory Corporation, Tokyo (JP)

(72) Inventors: Daisuke Kawamura, Kiyosu Aichi (JP); Koji Matsuo, Ama Aichi (JP); Masanobu Baba, Yokkaichi Mie (JP); Tatsuro Shinozaki, Yokkaichi Mie (JP); Taishi Ishikura, Kuwana Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/248,350

(22) Filed: Aug. 26, 2016

(65) Prior Publication Data
US 2017/0184958 A1   Jun. 29, 2017

(30) Foreign Application Priority Data

Dec. 25, 2015 (JP) ................. 2015-255040

(51) Int. Cl.
| | |
|---|---|
| *H01L 21/306* | (2006.01) |
| *G03F 7/00* | (2006.01) |
| *H01L 21/027* | (2006.01) |
| *H01L 21/308* | (2006.01) |
| *G03F 7/20* | (2006.01) |

(Continued)

(52) U.S. Cl.
CPC ............ *G03F 7/0002* (2013.01); *G03F 7/038* (2013.01); *G03F 7/039* (2013.01); *G03F 7/20* (2013.01); *H01L 21/0274* (2013.01); *H01L 21/3081* (2013.01); *H01L 21/3086* (2013.01); *H01L 21/30625* (2013.01)

(58) Field of Classification Search
CPC .............. B29C 37/006; B29C 37/0053; B29C 35/0888; B29C 2059/023; B29C 2035/0827; G03F 7/0002; G03F 9/7084; G03F 9/7076; B82Y 10/00; B82Y 40/00
See application file for complete search history.

(56) References Cited

U.S. PATENT DOCUMENTS

| | | | |
|---|---|---|---|
| 8,202,463 B2 | 6/2012 | Yoneda et al. | |
| 8,476,170 B2 | 7/2013 | Ojima | |

(Continued)

FOREIGN PATENT DOCUMENTS

| | | |
|---|---|---|
| JP | 4935312 B2 | 5/2012 |
| JP | 2014-213495 A | 11/2014 |
| JP | 2015-079915 A | 4/2015 |

*Primary Examiner* — Michael Carter
*Assistant Examiner* — Mohammed R Alam
(74) *Attorney, Agent, or Firm* — Patterson & Sheridan, LLP

(57) ABSTRACT

According to one embodiment, an imprint pattern forming method includes providing a substrate with a pattern formation region and a peripheral region, the peripheral region having a surface lower than a surface of the pattern formation region, located at a periphery of the pattern formation region. The method includes forming an auxiliary pattern with a predetermined height on at least a portion of the peripheral region, providing a resist layer on at least the pattern formation region, and imprinting the resist layer using a template by locating the template in a region which includes a portion of the pattern formation region and a portion of the peripheral region.

20 Claims, 22 Drawing Sheets

(51) Int. Cl.
*G03F 7/038* (2006.01)
*G03F 7/039* (2006.01)

(56) References Cited

U.S. PATENT DOCUMENTS

| | | | |
|---|---|---|---|
| 9,236,268 B2 | 1/2016 | Ishikura et al. | |
| 2008/0107796 A1* | 5/2008 | Cho | B05C 11/1013 427/8 |
| 2009/0267192 A1* | 10/2009 | Anderson | H01L 21/3212 257/618 |
| 2009/0267267 A1* | 10/2009 | Yoneda | B29C 37/0053 264/293 |
| 2010/0330807 A1 | 12/2010 | Kobayashi | |
| 2013/0078820 A1* | 3/2013 | Mikami | G03F 7/0002 438/778 |

\* cited by examiner

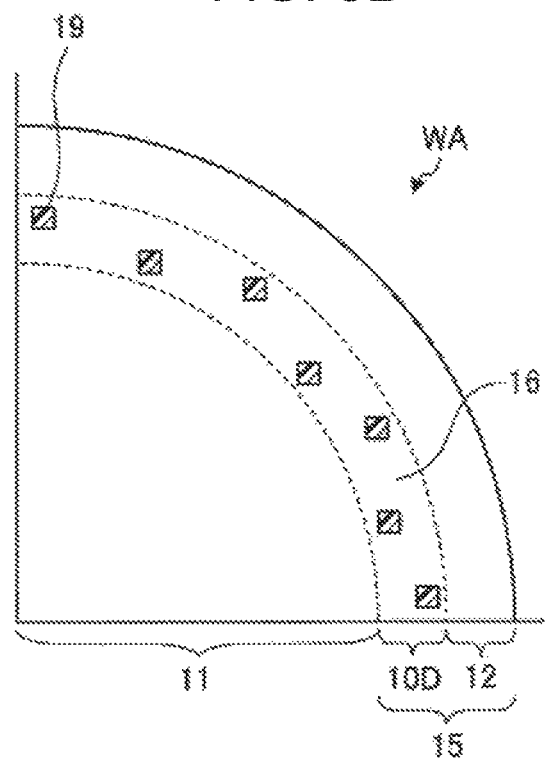

PATTERN FORMING METHOD

CROSS-REFERENCE TO RELATED APPLICATION

This application is based upon and claims the benefit of priority from Japanese Patent Application No. 2015-255040, filed on Dec. 25, 2015, the entire contents of which are incorporated herein by reference.

FIELD

Embodiments described herein relate generally to a pattern forming method.

BACKGROUND

In imprint lithography, a template presses a pattern into resist on a wafer. During imprint lithography, alignment accuracy between the template and the wafer is decreased due to a height difference between an element pattern formation region (central region) and a peripheral region on the wafer. When the alignment accuracy is decreased, a pattern element which is formed may not properly function. Accordingly, it is preferable that the alignment accuracy between the template and the wafer is increased.

DESCRIPTION OF THE DRAWINGS

FIGS. 8A and 8B are views illustrating a configuration example (2) of the auxiliary pattern according to the fourth embodiment.

DETAILED DESCRIPTION

According to one embodiment, there is provided a pattern forming method which can increase alignment accuracy between a template and a wafer.

In general, according to one embodiment, a pattern forming method is provided. The pattern forming method includes providing a substrate with a pattern formation region and a peripheral region, the peripheral region having a surface lower than a surface of the pattern formation region and located at a periphery of the pattern formation region. The method includes forming an auxiliary pattern with a predetermined height on at least a portion of the peripheral region, providing a resist layer on at least the pattern formation region, and imprinting the resist layer using a template by locating the template in a region which includes a portion of the pattern formation region and a portion of the peripheral region.

A pattern forming method according to embodiments will be hereinafter described in detail with reference to the accompanying drawings. The invention is not limited to the embodiments.

(First Embodiment)

Figure 1A:
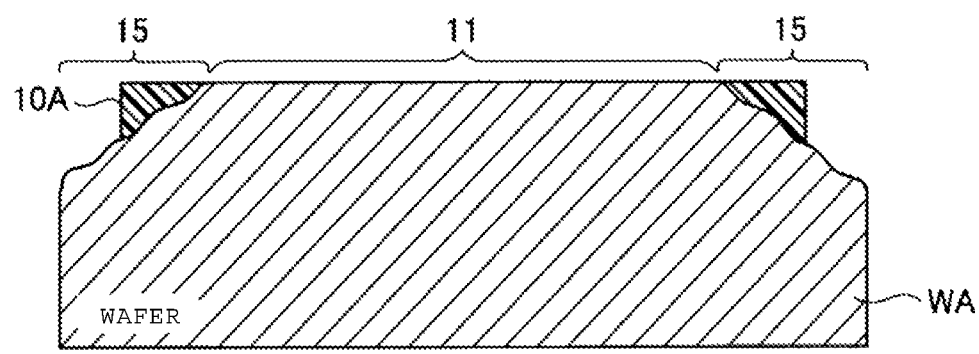
FIGS. 1A and 1B are views illustrating a configuration of an auxiliary pattern according to a first embodiment.
Figure 1B:
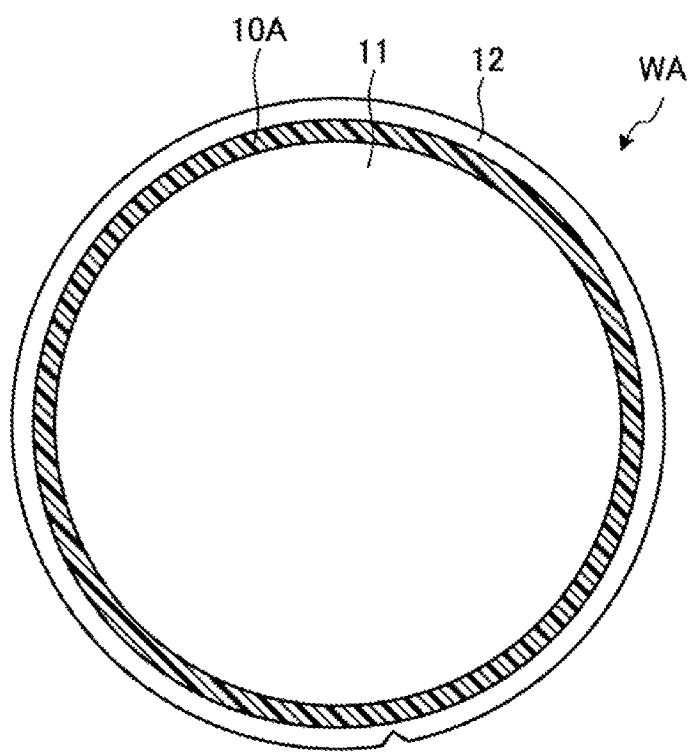

FIGS. 1A and 1B are views illustrating a configuration of an auxiliary pattern on a wafer according to a first embodiment. FIG. 1A illustrates a sectional view of a wafer WA which is a transfer target substrate. In addition, FIG. 1B illustrates a top view of the wafer WA.

The wafer WA includes a circular shaped central region as the element formation region 11, and an annular ring shaped peripheral region 15 as a region (region in which a complete chip is not formed) in which an element pattern to form a functioning device is not formed. On the wafer WA, the height of the peripheral region 15, also known as the bevel, is lower than the surface of the element formation region 11 and slopes downwardly therefrom in the direction of the edge of the wafer WA. In the present embodiment, an auxiliary pattern 10A with a predetermined height is formed in a portion of the peripheral region 15. Specifically, the auxiliary pattern 10A is formed at the central region side of the peripheral region 15, directly adjacent to or extending from the element formation region 11. A region of the peripheral region 15 in which the auxiliary pattern 10A is not formed in the outer region 12. Hence, a region in which the auxiliary pattern 10A is formed is interposed between the element formation region 11 and the outer region 12.

The auxiliary pattern 10A has atop surface of an annular ring shape. The auxiliary pattern 10A is formed in the wafer WA such that the height of the upper surface of the auxiliary pattern 10A is approximately the same as the height of the upper surface of the element formation region 11. An arc on an outer circumference side and an arc on an inner circumference side of the auxiliary pattern 10A are concentric circular arcs on the same concentric circle center as an outer circumference arc of the wafer WA.

In the element formation region 11 and the peripheral region 15, multiple height differences of several tens nm to several hundred nm occur on the exposed surface due to film forming, etching, or the like during a fabrication process of a semiconductor device on the wafer WA. In general, as the processes progress in sequence on the wafer WA, the total height of the wafer height differences and the number of the height differences increases. The depression of the peripheral region 15 with respect to the element formation region 11 is as small as that shown on an inner circumference side and is as large as that shown on an outer circumference side.

In the present embodiment, when there is no specific description thereof, the difference between an innermost height of the peripheral region 15 and an average height of the element formation region 11 will be described as a representative example of the wafer step difference in the following description. However, when the wafer step difference with respect to the peripheral region 15 is significantly small as several nm or the like, a region having the wafer step difference greater than a predetermined value will be considered the wafer step difference. In this manner, the wafer step difference is a difference between a height of a certain region in the peripheral region 15 and an average height of the element formation region 11.

In the present embodiment, an imprinting device performs imprint lithography such as nanoimprint lithography (NIL) with respect to the wafer WA on which the auxiliary pattern 10A was formed. The imprinting device performs processing (imprinting) by causing a template T1 to come into contact with a resist on the wafer WA when imprint lithography is performed. In the following description, a resist which is used for imprinting is referred to as a NIL resist in order to differentiate it from a photoresist. During pattern alignment of the template T1 of the imprinting device and the wafer WA, alignment marks on the template T1 and the wafer WA are detected in a state where a NIL resist 36 is interposed therebetween, and a relative movement of the template T1 and the wafer WA, and one or more operations for a change of the template T1 and/or the wafer WA position are performed in accordance with a desired amount of displacement therebetween. When the template T1 unintentionally comes into contact with the wafer WA, the relative movement and resulting position can be disturbed.

When the imprinting is performed, the NIL resist is located on the element formation region 11 and on the auxiliary pattern 10A. Hence, when the imprinting is performed in a shot (a single pressing of the template T1 into the resist) near the peripheral region 15 of the wafer WA (peripheral portion shot), the template T1 also presses on the NIL resist located on the auxiliary pattern 10A. As a result, when the imprinting is performed in the peripheral portion, the template T1 can be prevented from being distorted. Additionally, because the peripheral region supports the NIL resist thereon, it is possible to prevent the template T1 from coming into contact with the peripheral region 15.

The pattern forming method according to the present embodiment is applied to the wafer WA which has a bevel depth (height of wafer step difference) of several tens of nanometers to several hundreds of nanometers from the element formation region 11, and a width of the wafer step difference (bevel) is 100 μm or greater. The wafer step difference to which the pattern forming method according to the present embodiment is applied changes based upon the wafer WA to which the step difference is applied, a material of the template T1 which is used, a size of an imprinting pattern region which is formed by each stamping of the template T1, or the like. In addition, the height or the width of the wafer step difference is an example, and the pattern forming method according to the present embodiment may be applied to greater or lesser wafer step differences. In the following description, for the sake of convenience of drawing, the wafer step difference can be illustrated as multiple steps which are vertically formed, in a sectional view (schematic view of a cross section in a diameter direction) illustrating a structure of the wafer WA.

Figure 2:
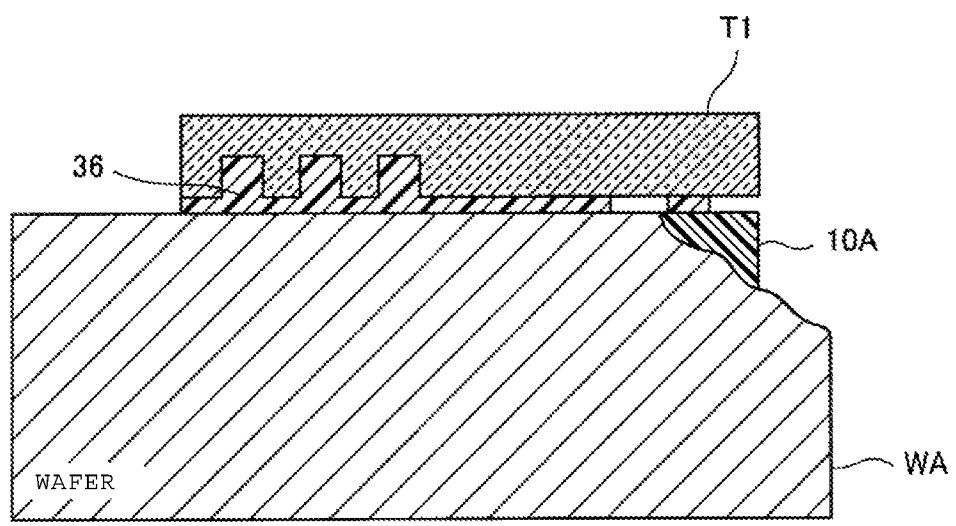
FIG. 2 is a view illustrating imprinting according to the first embodiment.

FIG. 2 is a view illustrating imprinting according to the first embodiment. After the auxiliary pattern 10A is formed on the wafer WA, a NIL resist 36 is dropped and spread onto an upper surface of the element formation region 11 and an upper surface of the auxiliary pattern 10A. Thereafter, the template T1 which is made by etching a quartz substrate presses into the NIL resist 36. At this time, the template T1 presses the on element formation region 11 and the auxiliary pattern 10A with the NIL resist 36 remaining therebetween. When the template T1 comes into contact with the NIL resist 36, the NIL resist 36 flows into the pattern of the template T1 by a capillary phenomenon.

After the template T1 is filled with the NIL resist 36 for a preset time, an upper portion of the template T1 is irradiated with UV light. Thereby, the NIL resist 36 is cured. By separating the template T1 from the cured NIL resist 36, a resist pattern which is an inverse of the template pattern is formed on the wafer WA.

Figure 3:
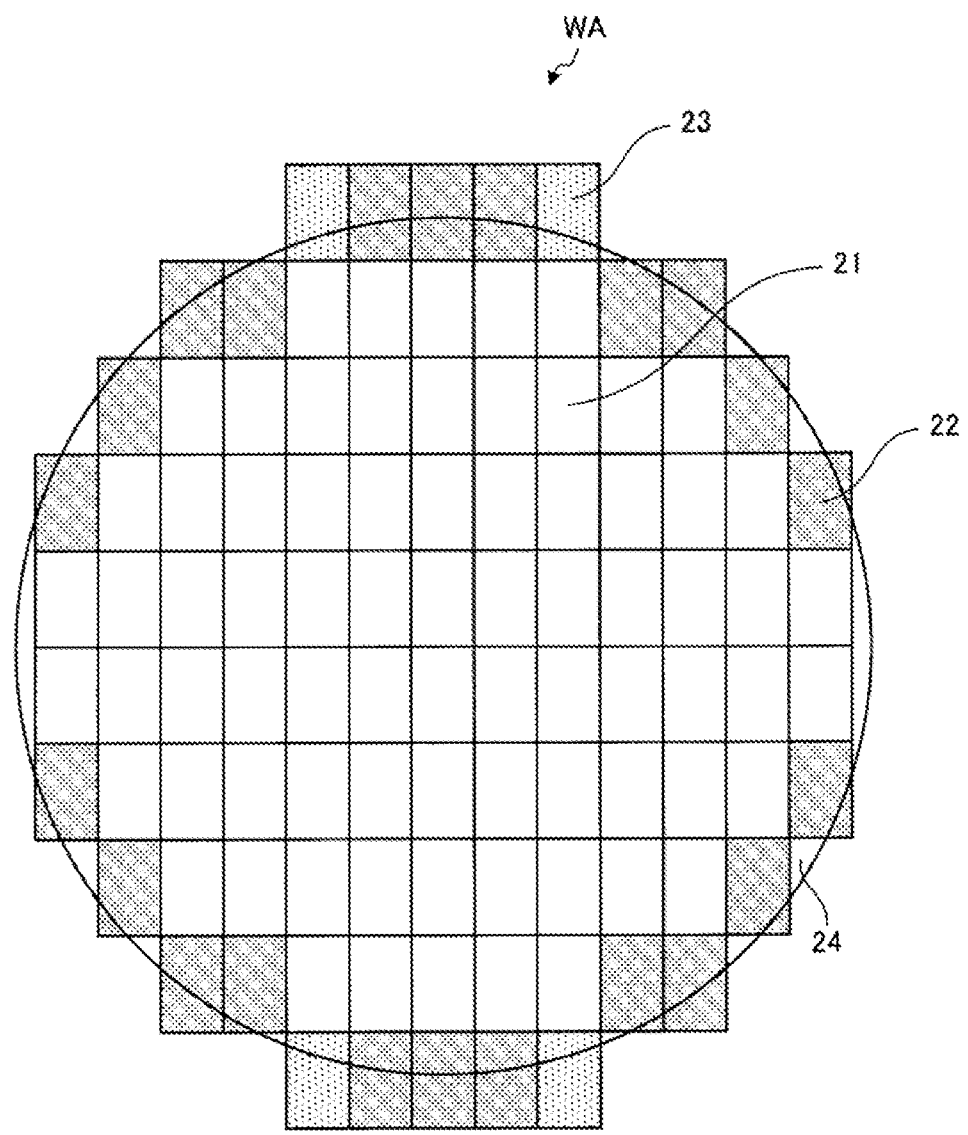
FIG. 3 is a top view illustrating a shot which is set on a wafer.

Now the arrangement position of the layout pattern of individual shots on the wafer WA will be described. FIG. 3 is a top view illustrating the shot pattern for the wafer WA, wherein each rectangle is the size of the imprinting template. A rectangular region which is illustrated as a rectangle on the wafer WA is thus one shot. The shot is an exposure unit of photolithography or a pressing unit of imprinting lithography and includes a resist pattern for more than one chip to be formed on the wafer WA, each chip pattern represented in FIG. 3 as a square.

The shots which are arranged on the wafer WA include a complete shot 21, an incomplete shot 22, and an invalid shot 23. The complete shot 21 location does not overlap the peripheral region 15 at all.

The incomplete shot 22 and the invalid shot 23 have squares of a chip pattern which overlap the peripheral region 15. Specifically, the incomplete shot 22 has a portion of the shot which is included in the peripheral region 15, and is a shot which includes at least one valid chip pattern formed entirely in the element formation region 11. The invalid shot 23 has a portion of the shot which is included in the peripheral region 15, and is a shot which includes no valid chip pattern formed entirely in the element formation region 11.

Multiple chips are arranged in the shot in general, and thus, a pattern can be formed in the incomplete shot 22 in an appropriate range in each process. There are following two cases in a height of the peripheral region 15 in the incomplete shot 22 according to a structure of an element or a fabrication process (layer).

(1) A case where a height of the peripheral region 15 in the incomplete shot 22 is approximately the same as a height of a region (a region 24 without a chip) in which a chip is not formed, (2) A case where the height of the peripheral region 15 in the incomplete shot 22 is located between a height of the complete shot 21 and a height of the region 24 without a chip.

In the present embodiment, the case (1) where the height of the peripheral region 15 in the incomplete shot 22 is approximately the same as the height of the region 24 without a chip will now be described. The height of the peripheral region 15 in the incomplete shot 22 may be the case (2) described above.

Figure 4A:
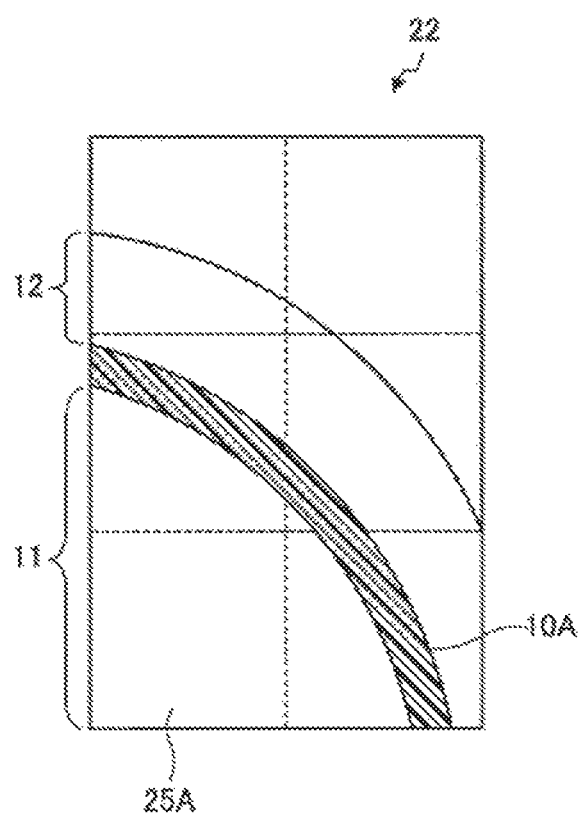
FIGS. 4A and 4B are top views respectively illustrating an incomplete shot and an invalid shot.
Figure 4B:
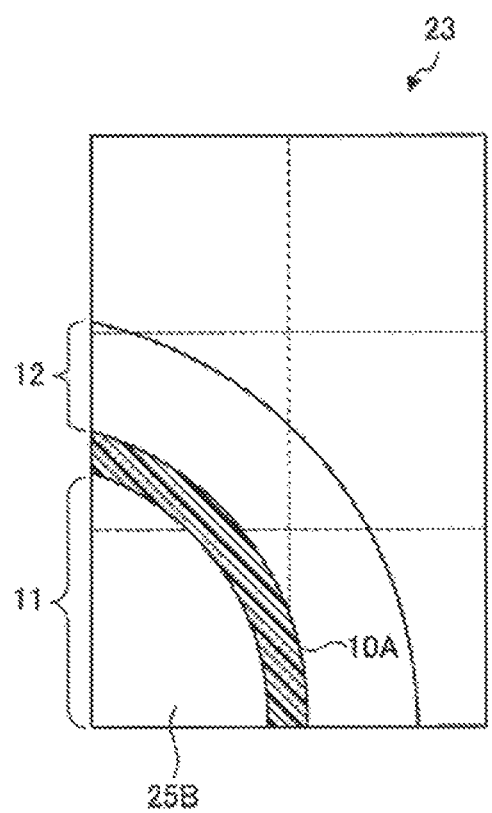

Here, a specific example of the incomplete shot 22 and the invalid shot 23 will be described. FIGS. 4A and 4B are top views respectively illustrating the incomplete shot and the invalid shot. FIG. 4A illustrates an example of the incomplete shot 22, and FIG. 4B illustrates an example of the invalid shot 23. Here, the incomplete shot 22 and the invalid shot 23 in a case where one shot is configured with six chip patterns will be described, each pattern being a square as shown in FIGS. 4A and 4B.

At least one chip of the incomplete shot 22 is located in the element formation region 11. FIG. 4A illustrates a case where an entire innermost chip pattern 25A of the incomplete shot 22 is included in the element formation region 11.

In addition, no complete chip pattern of the invalid shot 23 is completely located in the element formation region 11. FIG. 4B illustrates a case where an innermost pattern 25B of the invalid shot 23 is not fully included in the element formation region 11.

Various coating films may be formed between a material (NIL resist) which forms a pattern that is formed by imprinting and the wafer WA, when necessary. For example, a coating type organic film which is abbreviated as spun-on-carbon (SOC), a coating type silicon oxide diameter resin which is abbreviated to spun-on-glass (SOG), an adhesion film (adhesion layer) which increases adhesion to a film directly under the NIL resist, or the like may be formed on the wafer WA before the wafer WA is coated with the NIL resist.

The NIL resist is not limited to an organic material of (meth)acryl-based monomer which is polymerized by a radical reaction. The NIL resist may be a cationic-reaction-based material from the viewpoint of reaction mechanism. The NIL resist may be a material containing silicon or a material containing a metal from the viewpoint of material composition. In addition, on the wafer WA, the SOG film may not be formed, or an etching mask or other materials suitable for removal after being processed may be formed, according to the material of the NIL resist. In addition, another film may be added to a configuration on the wafer WA which is described in the present embodiment, for a processing mask, a processing stop film, or the like.

In the present embodiment, a resist (photoresist) for optical lithography is simply described as a positive resist or a negative resist due to a difference between pattern dissolution with respect to irradiated light, but this does not define a type or reaction mechanism of the resin of the resist, and a type of developing solution.

In the present embodiment, a case where the auxiliary pattern 10A is an organic film and is formed in an annular ring shape on the step difference region in the peripheral region 15 will be described. For example, a height of the wafer step difference is a height H1. In this case, a negative resist with the height (thickness) H1 is formed on the wafer WA.

A substrate batch exposure device or a wafer edge exposure (WEE) device is used to expose the negative resist. The substrate batch exposure device performs batch exposure of a predetermined region of the wafer WA. The WEE device exposes a predetermined area range of the wafer WA while rotating the wafer WA. The substrate batch exposure device or the wafer edge exposure (WEE) device selectively exposes the annular ring shaped region (auxiliary pattern region) on the peripheral region 15 in the wafer WA. Thereafter, the substrate batch exposure device or the WEE device performs appropriate heating and developing with respect to an unexposed region.

As a result, the auxiliary pattern 10A which configured with a negative resist pattern of an annular ring shape with a predetermined height is formed in the auxiliary pattern region of the wafer WA. The negative resist pattern needs to be insoluble against adhesion film or a NIL resist. Solvent resistance processing such as a high temperature baking, ultraviolet (UV) light irradiation, electron beam (EB) irradiation, or a combination thereof is performed for the negative resist pattern, when necessary. It is preferable that a thickness of the coating film of the NIL resist is determined by taking into account a film thickness change due to a development process, solvent resistance processing, or the like as the auxiliary pattern 10A is formed.

After the auxiliary pattern 10A is formed by the negative resist, an adhesion film is formed on the auxiliary pattern 10A. In addition, the NIL resist is arranged in the element formation region 11 on the wafer WA, and a predetermined range of regions in which the auxiliary pattern 10A is to be formed. Thereafter, the template T1 comes into contact with the NIL resist. In other words, pattern stamping of the NIL resist using the template T1 is performed. The template T1 may press into the NIL resist, and the NIL resist on the wafer WA may press into the template T1.

By relative movement between the wafer WA and the template T1 during stamping, alignment of the pattern of the template T1 with respect to the wafer WA is performed. After the NIL resist is irradiated with UV light for curing the NIL resist under appropriate conditions, the template T1 is separated from the patterned resist. Thereby, the NIL resist pattern is formed on the wafer WA.

It is preferable that the NIL resist is supplied to a desirable pattern formation region only, with respect to the incomplete shot 22. In other words, it is preferable that the NIL resist is arranged only in a region where a complete pattern can be formed, with respect to the incomplete shot 22, to minimize waste of the NIL resist material. The formed range of the NIL resist on the auxiliary pattern 10A is appropriately determined based on a viewpoint of alignment accuracy between the template T1 and the wafer WA, subsequent processing processes, or the like.

In the present embodiment, the auxiliary pattern 10A is formed in the peripheral region 15. Accordingly, it is possible to prevent the NIL resist from flowing into the depressed area of the wafer bevel in the peripheral portion of the element formation region 11 when stamping is performed on the incomplete shot 22. Thereby, a residual layer thickness (RLT) of the wafer step difference (boundary between the element formation region 11 and the peripheral region 15) can be prevented from being reduced, and thus, it is possible to prevent the quantity of NIL resist for the complete pattern in the incomplete shot from being reduced. In addition, since the resist does not flow into the recess of the peripheral region 15 and the template T1 can be prevented from tilting or bending downward on the peripheral region 15 side thereof, and thus, it is possible to prevent the template T1 from coming into contact with the wafer WA. Hence, it is possible to prevent resistance of the relative movement between the template T1 and the wafer WA from increasing. As a result, it is possible to prevent alignment accuracy of the pattern from degrading.

When the peripheral region 15 is exposed, a convex portion having a corner structure of the negative resist can be formed near the boundary between the element formation region 11 and the peripheral region 15. Accordingly, it is preferable that the inner side region of the auxiliary pattern 10A is positioned slightly spaced from the element formation region 11 such that the corner structure is not formed, by taking into account dissolution of the negative resist, accuracy of exposure position, reproducibility accuracy of the wafer step difference, or the like.

After the negative resist film for the auxiliary pattern 10A is coated in the peripheral region 15 at the edge of the wafer WF, any unwanted portion thereof is removed by cutting the resist outer edge or using another appropriate process.

Thereby, it is possible to prevent the template T1 from coming into contact with a region (outer end region 12) having a second step difference extending outwardly from the inner side of the peripheral region 15.

A coating film may be formed between the wafer WA and an adhesion film directly under the NIL resist, to enhance the processing transfer step of the NIL resist to the wafer WA. In this case, configurations of, for example, the following Example 1 to Example 3, or the like is used.

EXAMPLE 1

The auxiliary pattern 10A is a multi-layer film, and the outermost layer (top surface) thereof formed on the peripheral region 15 is a silicon-based film such as polysilicon or the like. In addition, the coating film is a multi-layer film in which an SOC film, an SOG film, and an adhesion film are stacked in an ascending order. In addition, an upper layer side of the adhesion film is an NIL resist which is an organic base.

EXAMPLE 2

The outermost layer of the multi-layer auxiliary pattern 10A in the peripheral region 15 is a silicon oxide film. The auxiliary pattern 10A film stack is an SOC film, an SOG film, and an adhesion film stacked in an ascending order. In addition, an upper layer side of the adhesion film is a NIL resist film which is an organic base.

EXAMPLE 3

The outermost layer of the multi-layer auxiliary pattern 10A in the peripheral region 15 is a SiN film. The auxiliary pattern 10A film stack is an SOC film and an adhesion film stacked in that order. In addition, an upper layer side of the adhesion film is a NIL resist film which is an organic base. In a case of Example 3, after the NIL resist layer is formed, a silicon containing pattern inversion coating film is formed, and a pattern inversion process may be used. After the silicon containing pattern inversion coating film is formed, the silicon containing pattern inversion coating film is etched back until an upper portion of the NIL resist layer is exposed. Subsequently, the NIL resist and the SOC film are processed using the silicon containing pattern inversion coating film as a processing mask, whereby an NIL resist pattern and an inverted SOC pattern are formed.

In the present embodiment, the auxiliary pattern 10A may be formed by a batch exposure device, but the auxiliary pattern 10A may also be formed by an exposure device which performs exposure in individual shot units. When the auxiliary pattern 10A is formed using the negative resist, a region in which the auxiliary pattern 10A is formed is divided into rectangular regions, with respect to the incomplete shot 22. In addition, each rectangular region is exposed, and other regions thereof are not exposed.

In addition, when the auxiliary pattern 10A is formed using a positive resist, a region (the element formation region 11) other than the auxiliary pattern 10A is divided into rectangular regions, with respect to an incomplete shot 22. In addition, each rectangular region is exposed, and the auxiliary pattern 10A is not exposed.

Meanwhile, when the auxiliary pattern 10A is formed by the batch exposure device, the regions in the incomplete shot 22 that do not form complete patterns over the pattern forming region need not be divided, and thus, it is possible to efficiently form the auxiliary pattern 10A.

In general, the positive resist is lower in solvent resistance than the negative resist. Accordingly, when the positive resist is used, appropriate processing is performed to obtain the solvent resistance against the NIL resist or an appropriate coating type processing mask required for imprint lithography pattern transfer. When the positive resist is used, for example, high temperature heating, UV light irradiation, EB irradiation, ion irradiation, plasma processing, and processing of a combination thereof are selectively performed in each process.

The auxiliary pattern 10A is formed, for example, for each patterning layer formed in a wafer process. Thereby, a multilayer pattern semiconductor device (semiconductor integrated circuit) is fabricated. Specifically, after a processing target film is formed on the wafer WA, the auxiliary pattern 10A is formed in the peripheral region 15. Then, the NIL resist 36 is dropped on or dropped and spread on the element formation region 11 and on the auxiliary pattern 10A, and imprinting is performed. The processing target film is then etched using a NIL resist pattern formed by the imprinting step as a mask. Thereby, an actual pattern corresponding to the NIL resist pattern is formed on or in the target film on the wafer WA. When a semiconductor device is fabricated, processing of forming the auxiliary pattern 10A, the imprinting, the etching, or the like is repeated for each layer.

In this manner, in the first embodiment, the auxiliary pattern 10A with a predetermined height is formed with respect to at least a portion of the peripheral region 15 having a height lower than a height of the element formation region 11 on the wafer WA. In addition, imprinting is performed in a shot region including a portion of the element formation region 11 and a portion of the peripheral region 15 using the template T1. Thereby, it is possible to prevent the wafer WA from coming into contact with the template T1, or to reduce a contact area thereof. Hence, it is possible to increase alignment accuracy between the template T1 and the wafer WA. In addition, collision between the template T1 and the wafer WA can be prevented in the peripheral region 15, and thus, it is possible to prevent the template T1 from being broken.

(Second Embodiment)

Figure 5A:
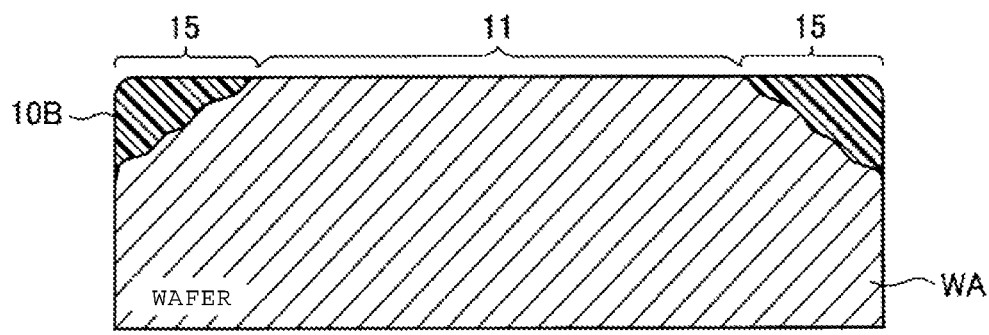
FIGS. 5A and 5B are views illustrating a configuration of an auxiliary pattern according to a second embodiment.
Figure 5B:
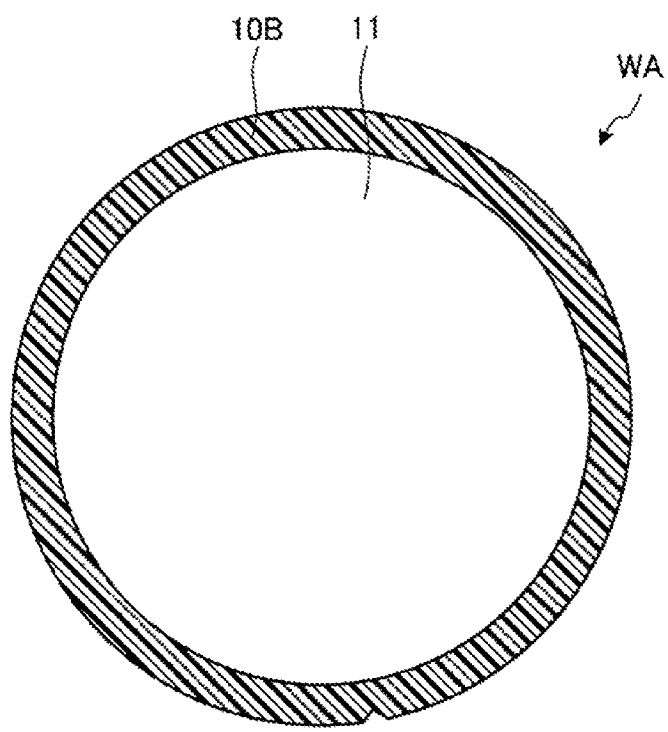

Next, a second embodiment will be described with reference to FIG. 5. In the second embodiment, an auxiliary pattern is formed by coating of the wafer WA. FIGS. 5A and 5B are views illustrating a configuration of an auxiliary pattern according to the second embodiment. FIG. 5A illustrates a sectional view of the wafer WA according to the second embodiment. In addition, FIG. 5B illustrates a top view of the wafer WA according to the second embodiment. In each configuration element of FIGS. 5A and 5B, the same symbols or reference numerals will be attached to the configuration elements having the same function as the wafer WA according to the first embodiment illustrated in FIGS. 1A and 1B, and repeated descriptions will be omitted.

In the present embodiment, an auxiliary pattern 10B is formed on the entirety of the peripheral region 15. Hence, in the present embodiment, the outer end region 12 of the peripheral is not present, as it is covered by the auxiliary pattern 10B. In addition, an auxiliary pattern region according to the present embodiment is the same region as the peripheral region 15. The auxiliary pattern 10B has an upper surface of an annular ring shape. An arc on the inner circumference side of the auxiliary pattern 10B is an arc on the same concentric circle center as an outer circumference arc of the wafer WA. In the wafer WA, the auxiliary pattern 10B is formed such that an upper surface of the auxiliary pattern 10B has approximately the same height as an upper surface of the element formation region 11.

The auxiliary pattern 10B is formed by a coating device. An ejection nozzle of the coating device continuously ejects predetermined chemical solution onto the peripheral region 15. At this time, the coating device relatively rotates the wafer WA with respect to the ejection nozzle. Thereby, the peripheral region 15 is coated with the chemical solution. As a result, the auxiliary pattern 10B of the annular ring shape is formed on the peripheral region 15 of the wafer WA.

The chemical solution is, for example, a negative resist or a positive resist. When the positive resist is used, appropriate processing is performed to obtain solvent resistance against the NIL resist or an appropriate coating type processing mask required for processing transfer. When the positive resist is used, for example, high temperature heating, UV light irradiation, EB irradiation, and processing of a combination thereof are selectively performed in each process.

Drying, solvent resistance imparting, and the like are performed for the auxiliary pattern 10B, when necessary. The height of the auxiliary pattern 10B can be changed by drying and solvent resistance imparting processes. Accordingly, chemical solution coating conditions may be adjusted according to a step difference between the element formation region 11 and the auxiliary pattern 10B on the wafer WA, after the solvent resistance imparting. Main elements of adjustment parameters of the coating conditions include the type of the chemical solution (type of solvent, the amount of solid content, type of additive), the number of wafer rotation or the number of nozzle rotation at the time of coating, the ejection rate of chemical solution, and the like.

When the chemical solution is coated at a single stroke, a width or a height of the auxiliary pattern 10B is different at a starting point and an ending point of ejection. Accordingly, it is preferable that a region which is not a pattern formation target is set as a start point and an end point of coating on the wafer WA.

Figure 6:
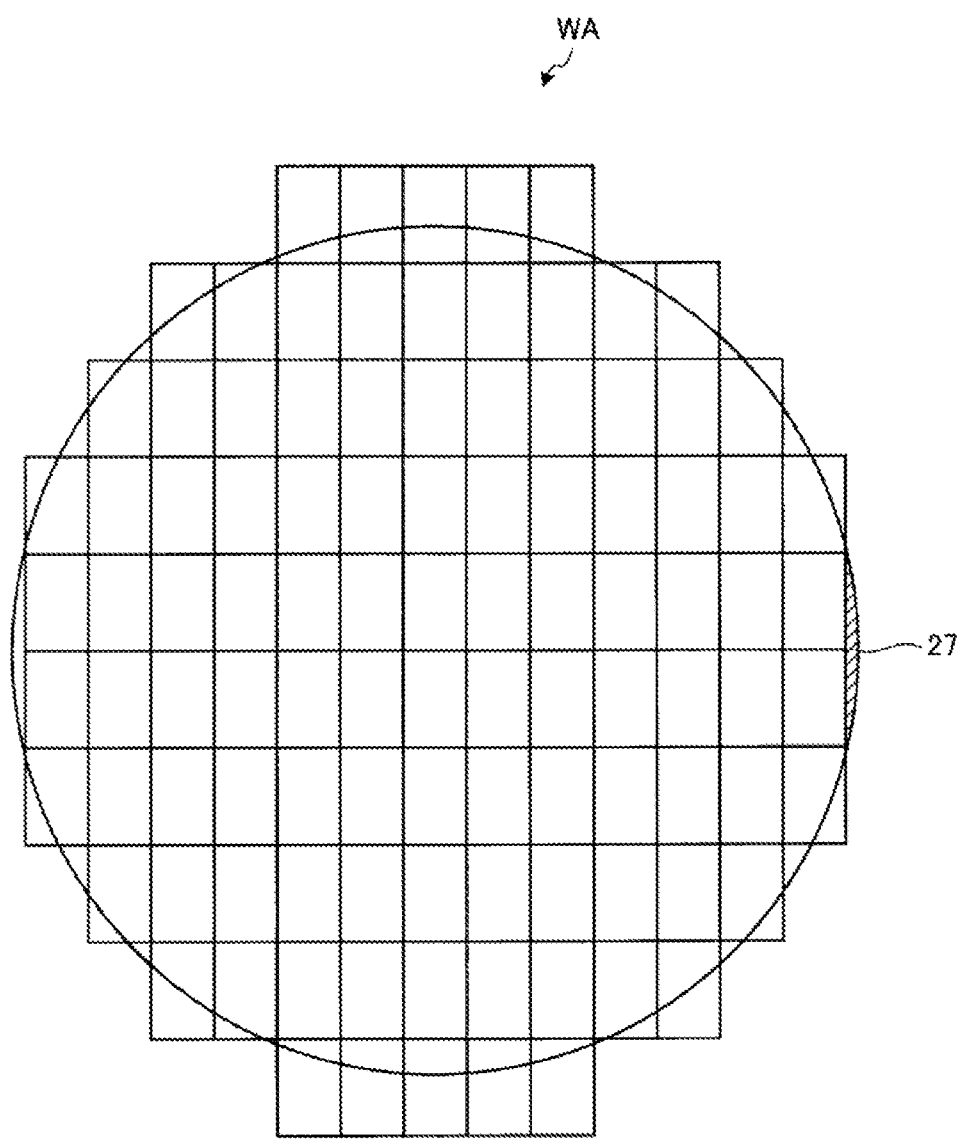
FIG. 6 is a view illustrating a start point and an end point in which chemical solution is ejected from a nozzle, according to the second embodiment.

FIG. 6 is a view illustrating the start point and the end point of ejection. As illustrated in FIG. 6, a shot is not arranged in a narrow region 27 on which a chip is not to be formed among the regions on the wafer WA. The narrow region 27 does not become a pattern formation target, and is thus set as a start point and an end point of coating the peripheral region 15 on the wafer WA. For example, a region which does not become the pattern formation target in the NIL process because the region is too small to form valid elements is set as the narrow region 27.

When the chemical solution is coated at a single stroke, a straight nozzle using a pump may be used, and an electrostatic nozzle for stabilizing the amount of ejection may be used. In addition, the auxiliary pattern 10B may be formed by causing a chemical solution which is ejected according to an ink jet method come into contact with another chemical solution. The chemical solution which is used in the present embodiment includes a novolac-based resist, an SOC film, and the like.

In this manner, according to the second embodiment, the auxiliary pattern 10B is formed by coating only, without using a pattern exposure process or a development process, and thus, it is possible to reduce various costs of a fabrication process, fabrication energy, or the like, or environment load.

(Third Embodiment)

Next, a third embodiment will be described. In the third embodiment, an auxiliary pattern is formed by removing a region with a thickness greater than a desirable height according to etching or the like.

When the auxiliary pattern 10B is formed according to the method described in the second embodiment, a shape of the auxiliary pattern 10B can vary. For example, control fluctuation at the time of forming the auxiliary pattern 10B, a difference between the wafers WA with a shape of the peripheral region 15, a speed difference in a wafer rotation direction during spin-coating, or the like can be generated. In this case, the height of the incomplete shot 22, a distance between the element formation region 11 and the auxiliary pattern 10B, the height of the auxiliary pattern 10B, or the like can vary.

When the auxiliary pattern 10B is formed, the wafer WA is coated with chemical solution. At this time, in the present embodiment, the chemical solution is intentionally coated such that the chemical solution ascends above the height of the element formation region 11. Thereafter, a portion of the auxiliary pattern with a predetermined thickness is removed by etching. At this time, the pattern (removed pattern) which is removed by etching is a pattern which ascends above the element formation region 11, among the patterns (chemical solution patterns) which are formed by the chemical solution. The pattern other than the removed pattern portion forms the auxiliary pattern 10B.

Specifically, after a chemical solution coating and a chemical solution drying are performed, etching is performed, and a portion of the chemical solution pattern is removed by etching to a height equal to a height of the element formation region 11. It is preferable that wet etching is used as an etching method. An acid aqueous solution which is used for an SH (sulfuric acid/hydrogen peroxide) processing, a DHF (dilute hydrofluoric acid) processing or the like may be used as a wet etching chemical solution of the auxiliary pattern 10B which is configured with an organic material, and organic solvent, an alkaline aqueous solution, or the like may be used as the wet etching chemical solution. After various types of wet etching are performed, an appropriate cleaning which uses pure water or the like is performed.

When a solvent resistance process is performed with respect to a pattern material (chemical solution) of the auxiliary pattern 10B, it is preferable that wet etching is performed before the solvent resistance process is performed. Particularly, when a novolac-based resist is used, it is possible to use the alkaline aqueous solution such as choline or tetramethylammonium hydroxide aqueous solution after a post apply bake process whose main object is to volatilize the solvent. In addition, it is preferable that various acid aqueous solutions or an alkaline aqueous solution have low concentration and etching rate is decreased in an appropriate range, in order to increase etching accuracy. Thereby, it is possible to obtain the auxiliary pattern 10B with a stable height.

Dry etching may be used as the etching method. The dry etching is performed using oxygen-based gas. When the dry etching is used, cleaning for removing foreign substances may be performed after the dry etching.

In this manner, according to the third embodiment, the pattern which ascends above the element formation region 11 among the chemical solution patterns is removed, and thus, it is possible to obtain the auxiliary pattern 10B with a stable height.

(Fourth Embodiment)

Next, a fourth embodiment will be described with reference to FIG. 7 to FIG. 9. In the fourth embodiment, an auxiliary pattern is configured of multiple, isolated from one another, shapes.

Figure 7A:
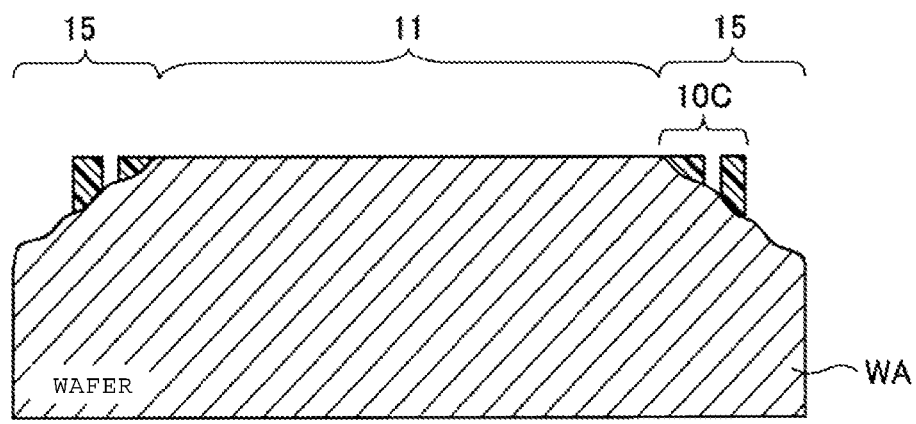
FIGS. 7A and 7B are views illustrating a configuration example (1) of an auxiliary pattern according to a fourth embodiment.
Figure 7B:
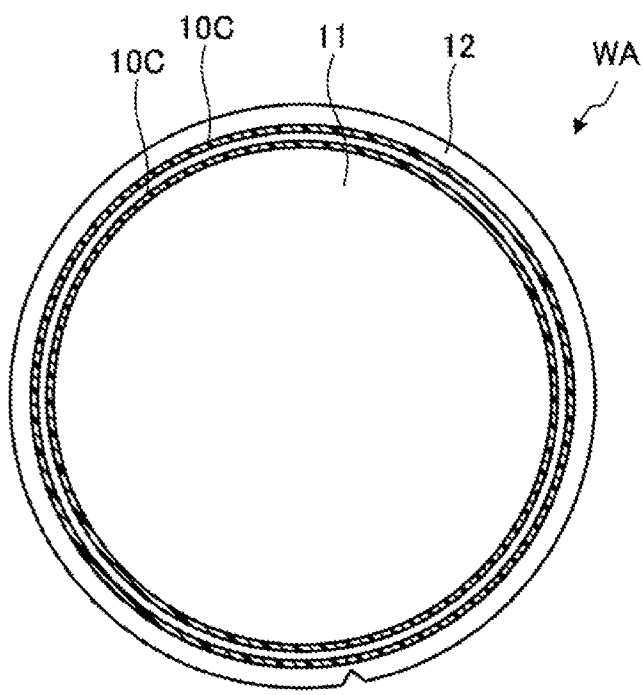

FIGS. 7A and 7B are views illustrating a configuration example (1) of an auxiliary pattern according to the fourth embodiment. FIG. 7A illustrates a sectional view of the wafer WA according to the fourth embodiment. In addition, FIG. 7B illustrates a top view of the wafer WA according to the fourth embodiment. In each configuration element of FIGS. 7A and 7B, the same symbols or reference numerals will be attached to the configuration elements having the same function as the wafer WA according to the first embodiment illustrated in FIGS. 1A and 1B, and repeated descriptions will be omitted.

In the present embodiment, an auxiliary pattern 10C which is configured as multiple patterns is formed in a portion of the peripheral region 15. The auxiliary pattern 10C is formed in the same auxiliary pattern region as the auxiliary pattern 10A illustrated in FIGS. 1A and 1B.

When the auxiliary pattern 10C is formed, a resist film is formed on the wafer WA. Subsequently, select exposure is performed in a region where the auxiliary pattern 10C is formed on the wafer WA. Thereafter, the wafer WA is developed, and the auxiliary pattern 10C is formed. In this case, solvent resistance processing is performed according to a resist material which is used in the same manner as in the first to third embodiments, when necessary.

An exposure region according to the present embodiment is not one continuous region of an annular ring shape, but multiple independent regions. In the wafer WA, for example, multiple regions of a concentric shape and an annular ring shape are exposed. Thereby, multiple annular ring shape patterns are formed in the same region as the auxiliary pattern region in which the auxiliary pattern 10A is formed, as the auxiliary pattern 10C. In each annular ring shape pattern in the auxiliary pattern 10C, an arc on an outer circumference side and an arc on an inner circumference side are arcs of the same concentric circle center as an outer circumference arc of the wafer WA.

When stamping is performed on the incomplete shot 22, at least a portion of the NIL resist on the auxiliary pattern 10C is stamped by the template T1. In addition, when the NIL resist is not supplied to the auxiliary pattern 10C, the template T1 directly comes into contact with the wafer WA.

In various devices such as an imprinting device, there may be much transport dust, or there may be much dust or the like, when vacuum film formation is performed immediately before imprinting is performed. In this case, a pattern on the template T1 can be damaged in a position which is stamped. From this viewpoint, the auxiliary pattern is divided into multiple patterns and a contact area between the template T1 and the auxiliary pattern 10C is reduced in the same manner as in the auxiliary pattern 10C, and thus, it is possible to reduce a damage risk of the template T1.

A material of the template T1 requires pattern fidelity of the imprinting formation pattern, and has elasticity but has a small amount of physical size change like glass, quartz, a metal or the like. Accordingly, the template T1 can tilt or curve on the wafer WA side, in the peripheral region 15 of the wafer WA in the incomplete shot 22. In this case, the entire surfaces of the wafer WA and the template T1 do not evenly come into contact with each other and specific portions (for example, regions in which the auxiliary pattern 10C is formed) thereof are come into contact with each other. In addition, the template T1 is deformed in an opposite direction (direction in which the template T1 is warped) away from the upper surface of the wafer WA in the element formation region 11. As a result, the template T1 weakly comes into contact with the wafer WA, or it is considered that the template slightly floats on the wafer. In this case, when there is no dummy pattern (auxiliary pattern 10C) in a portion in which the template would strongly come into contact with the auxiliary pattern 10A, that is, an outer region where the downwardly bending portion of the template will extend below the upper surface of the resist on the element formation region 11, resistance is reduced when the template T1 is moved by contact.

In the present embodiment, the auxiliary pattern 10C is configured in a multiple separated manner and does not extend to the wafer WA edge, and thus, resistance is reduced when the template T1 is moved by contact. As a result, alignment accuracy of the template T1 is increased.

Now an example of an auxiliary pattern which is configured with a divided structure is described. A first example of the auxiliary pattern with a divided structure is the auxiliary pattern 10C. As described above, the auxiliary pattern 10C has a multiple-annular-ring structure which is configured with a pattern of an annular ring shape and concentric circle shape.

When the auxiliary pattern 10C is formed, the upper portion of the wafer WA is coated with a positive resist. In addition, in the positive resist, a separation region between a pattern formation region and a multiple-annular-ring structure is exposed. The auxiliary pattern 10C is formed by, for example, the batch exposure device. By the batch exposure device, the wafer WA is efficiently exposed.

When a negative resist is used, only a remaining portion of the multiple-annular-ring structure which is the auxiliary pattern 10C may be exposed. In this case, the batch exposure device may be used, and it is possible to efficiently form the auxiliary pattern 10C, also by providing a shield mask on a mechanism of the WEE device.

A second example of the auxiliary pattern of the division structure is an auxiliary pattern 10D having a pillar shape. The auxiliary pattern 10D has multiple pillar shaped auxiliary patterns. The auxiliary pattern 10D is formed in the same region as a region in which the auxiliary pattern 10A is formed.

Figure 8A:
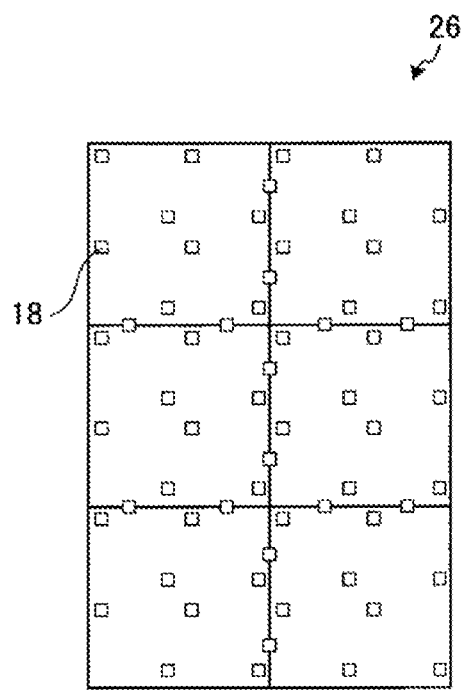

FIGS. 8A and 8B are views illustrating a configuration example (2) of the auxiliary pattern according to the fourth embodiment. FIG. 8A illustrates a top view of a shot pattern 26 in which the pillar shaped auxiliary pattern is arranged. In addition, FIG. 8B is a top view illustrating a portion of the wafer WA in which the auxiliary pattern 10D is arranged. The shot pattern 26 is, for example, a mask pattern of a photomask.

As illustrated in FIG. 8A, multiple pillar shape auxiliary patterns 18 are arranged in the shot pattern 26. The pillar shaped auxiliary pattern 18 may be arranged in a scribe line, and may be arranged in a chip region.

Pillar shaped auxiliary patterns 19 on the wafer WA are formed in multiple grids (shots) having a two-dimensional periodic structure in an X direction and a Y direction. In addition, the pillar shaped auxiliary patterns 18 in the shot pattern 26 overlap positions of the pillar shape auxiliary pattern 18 which are arranged in the incomplete shot 22, in each shot. In other words, the positions of the pillar shape auxiliary patterns 18 in the entire incomplete shots 22 overlap each other in one shot, but are in the shot pattern 26. When the shot takes many chips, a gap between the shots is equal to a dicing line width (scribe line width) in the shot, and the arrangement of the chips has a constant periodicity in a surface of the wafer WA, the two-dimension periodic structure may have a chip arrangement periodicity.

As illustrated in FIG. 8B, in the present embodiment, the auxiliary pattern 10D is formed in a portion of the peripheral region 15. Specifically, the auxiliary pattern 10D is formed in an inner side region (auxiliary pattern region 16) in the peripheral region 15. A region in which the auxiliary pattern 10D is not formed in the peripheral region 15 is the outer end region 12. Hence, a region which is interposed between the element formation region 11 and the outer end region 12 is the auxiliary pattern region (annular ring shape region) 16 in which the auxiliary pattern 10D is formed. The annular ring shape region in which the auxiliary pattern 10D is formed is the same region as the annular ring shape region in which the auxiliary pattern 10A is formed.

The multiple pillar shaped auxiliary patterns 19 are arranged in the auxiliary pattern region 16 in which the auxiliary pattern 10D is formed. A portion in which the pillar shaped auxiliary pattern 19 in the shot pattern 26 overlaps the auxiliary pattern region 16 (annular ring shape region) where the auxiliary pattern 10D is formed in the incomplete shot 22, becomes a position where the pillar shaped auxiliary pattern 19 is formed. The pillar shaped auxiliary patterns 19 are efficiently formed by performing batch exposure of the wafer WA using the batch exposure device.

It is preferable that the pillar shape auxiliary pattern 19 according to the present embodiment is formed in a region in which defects due to breakage of the template T1 at the time of imprinting do not generate abnormalities in subsequent processing and in the function of elements which are formed, for example, where non-device patterned portions of the template T1 overly the pillar shape auxiliary pattern 19. For example, a region which forms a portion of many remaining patterns in the imprinting process is a portion remaining after the imprinting process, and regardless of an element function, is an example (arrangement example 1) of a region in which it is required to form the pillar shape auxiliary pattern 19.

In addition, a region which is a portion of many remaining patterns in the imprinting and in which the pillar shape auxiliary patterns 19 are collectively removed in a subsequent processing process, is an example (arrangement example 2) of a region which is required for forming the pillar shape auxiliary pattern 19.

In the present embodiment, for example, the pillar shape auxiliary patterns 19 are arranged in positions of the aforementioned arrangement examples 1 and 2. Thereby, even when the template T1 is damaged by contact between the template T1 and the wafer WA in the imprinting process, an abnormal change of the NIL resist pattern to a subsequent shot does not affect the element function because the damage occurs in a non-device patterned region of the template T1. In addition, even when the NIL resist arranged on the auxiliary pattern 10D is uncured thereby being attached to a subsequent shot, the abnormal change of the NIL resist pattern to a subsequent shot does not affect the element function because the uncured resist remains on the template T1 in a non-device patterned area thereof.

Figure 9A:
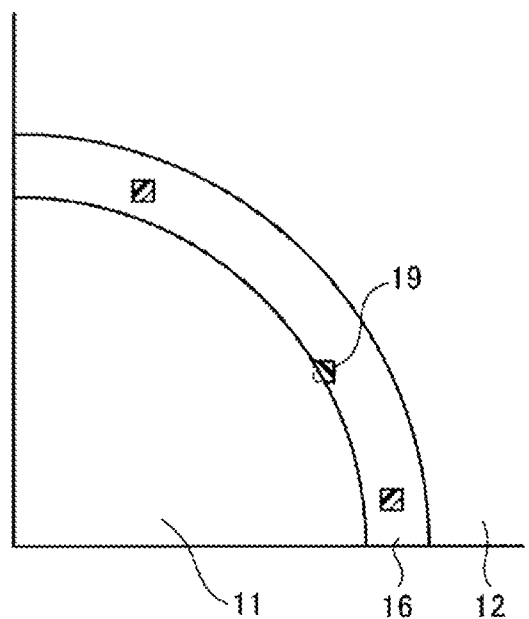
FIGS. 9A and 9B are views illustrating a pillar shape auxiliary pattern whose shape is adjusted.
Figure 9B:
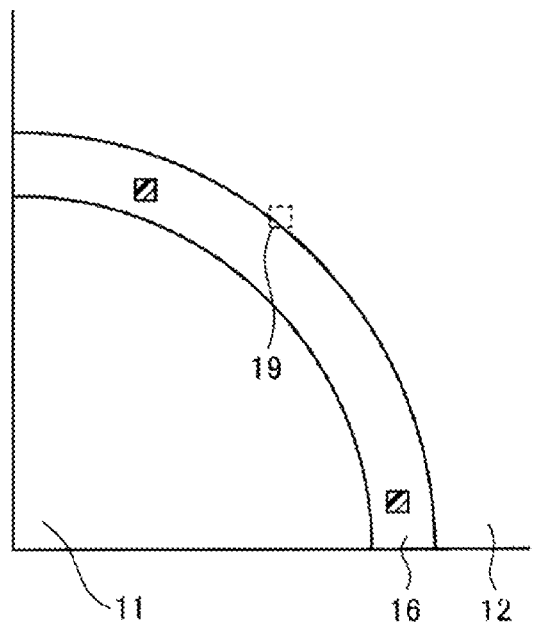

A shape of the pillars or spacing of the pillars of the pillar shape auxiliary pattern 19 may be adjusted in the vicinity of a boundary between annular ring shape regions in which the auxiliary patterns 10D are formed. FIGS. 9A and 9B are views illustrating the pillar shape auxiliary pattern whose shape is adjusted. FIG. 9A illustrates a first example of the auxiliary pattern region 16 in which the auxiliary pattern 10D is formed, and FIG. 9B illustrates a second example of the auxiliary pattern region 16 in which the auxiliary pattern 10D is formed.

There is a pillar shape auxiliary pattern which protrudes outside the auxiliary pattern region, among the pillar shape auxiliary patterns 19 which are arranged in an auxiliary pattern region 16A. For example, as illustrated in FIG. 9A, there is a case where a portion of the pillar shape auxiliary patterns 19 protrudes from the auxiliary pattern region 16, thereby overlapping the element formation region 11. Only the portion overlapping the auxiliary pattern region 16 in the pillar shape auxiliary pattern 19 may be set as a formation target, and a portion overlapping the element formation region 11 may be excluded from the formation target. In other words, only the portion overlapping the auxiliary pattern region 16 in the pillar shape auxiliary pattern 19 may remain as a portion of the pillar shape auxiliary pattern 19.

As illustrated in FIG. 9B, there is a case where a portion of the pillar shape auxiliary pattern 19 protrudes from the auxiliary pattern region 16, thereby overlapping the outer end region 12. Only the portion overlapping the auxiliary pattern region 16 in the pillar shape auxiliary pattern 19 may be set as the formation target, and the portion overlapping the outer end region 12 may be excluded from the formation target. In other words, only the portion overlapping the auxiliary pattern region 16 in the pillar shape auxiliary pattern 19 may remain as a portion of the pillar shape auxiliary pattern 19.

In this manner, according to the fourth embodiment, the auxiliary patterns 10C and 10D are configured in a multiple separated manner, and thus, a contact area between the template T1 and the auxiliary patterns 10C and 10D can be reduced. Hence, even when dust is generated at the time of imprinting, it is possible to reduce a possibility that the template T1 is broken.

(Fifth Embodiment)

Next, a fifth embodiment will be described with reference to FIG. 10A to FIG. 11D. In the fifth embodiment, an auxiliary pattern is formed by a processing target film (film which is processed using the NIL resist as a mask) which is processed after the imprinting.

FIGS. 10A to 10F are views illustrating the processing sequence (1) of imprinting according to the fifth embodiment. In addition, FIGS. 11A to 11D are views illustrating the processing sequence (2) of the imprinting according to the fifth embodiment. FIG. 10A to FIG. 11D illustrate sectional views the wafer WA or the like during the imprinting process. In FIG. 10A to FIG. 11D, a film below a first amorphous silicon film (hereinafter, referred to as aSi) (here, referred to as aSi31) on the wafer WA is not illustrated. In addition, FIG. 10A to FIG. 11D schematically illustrate a step difference between the element formation region 11 and the peripheral region 15.

Figure 10A:
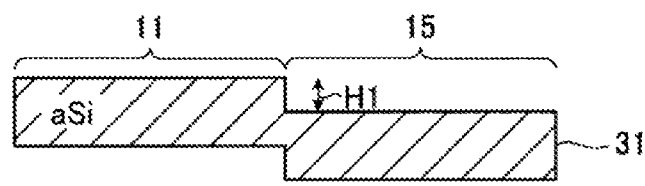
FIGS. 10A to 10F are views illustrating processing sequence (1) of imprinting according to a fifth embodiment.

As illustrated in FIG. 10A, at a point of time when aSi31 is arranged on the wafer WA, a step difference (initial step difference) with a height H1 is generated in the peripheral portion of the wafer WA. The step difference is a height difference between the element formation region 11 and the peripheral region 15.

Figure 10B:
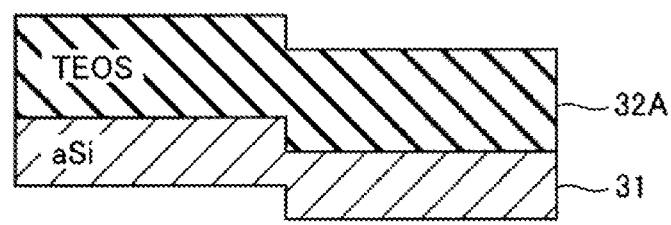

Subsequently, as illustrated in FIG. 10B, a silicon oxide film to be patterned (hereinafter, referred to as TEOS) (here, referred to as TEOS32A) which is configured of tetraethoxysilane is formed on the aSi 31. TEOS layer 32A is a film having a desirable thickness greater than H1. At this time, a step difference of the peripheral portion of the wafer WA remains approximately the height H1.

Figure 10C:
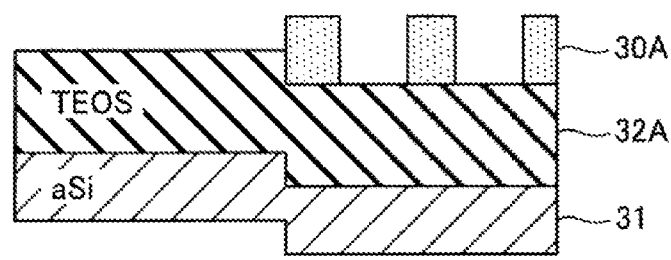

As illustrated in FIG. 10C, a processing mask (resist pattern) 30A is formed in the auxiliary pattern region 16 of the wafer WA in which TEOS layer 32A is formed. When the processing mask 30A is formed, various types of photolithography including, for example, coating of a resist film, exposing, developing, and the like are used. It is preferable that exposing is performed by the batch exposure device in order to efficiently form the auxiliary pattern in the exposing in that case.

An auxiliary pattern formation method using an organic film, which is described in the first, third, and fourth embodiments, may be used to form the processing mask 30A of the auxiliary pattern region 16. In the present embodiment, a case where the auxiliary pattern is configured with multiple patterns which are separated from each other will be described, in the same manner as in the fourth embodiment.

Figure 10D:
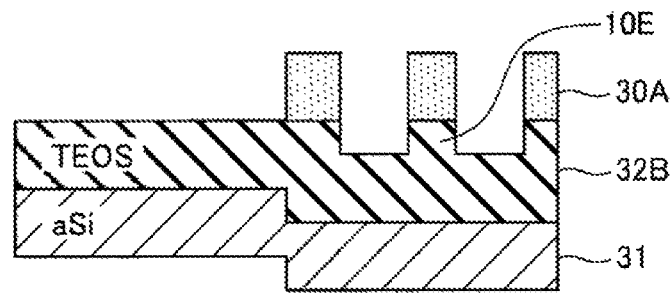

As illustrated in FIG. 10D, after the processing mask 30A is formed, the processing mask 30A pattern is transferred to TEOS layer 32A. Dry etching and cleaning or wet etching and cleaning can be used as a transfer method. Thereby, TEOS layer 32A becomes TEOS layer 32B. During the etching, the element formation region 11 is also etched to the upper surface of the peripheral region 15 protected by the mask 30A. As a result, an auxiliary pattern 10E with a predetermined height is formed on the auxiliary pattern region 16 of the wafer WA. Here, the auxiliary pattern 10E is a portion of TEOS layer 32B. An upper surface of the auxiliary pattern 10E may have a pattern of an annular ring shape, and may have a pattern of a pillar shape.

Figure 10E:
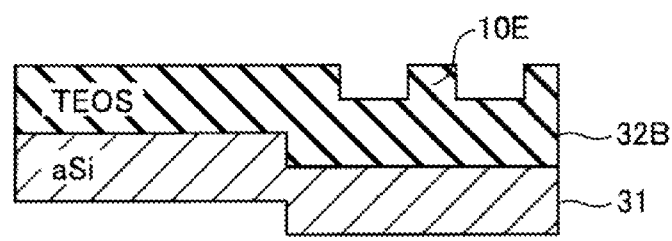
Figure 10F:
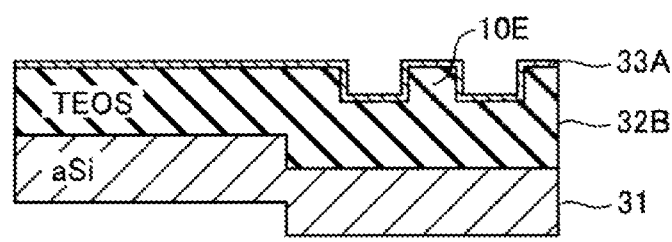

Thereafter, as illustrated in FIG. 10E, the processing mask 30A is removed from the wafer WA. Thereby, the entire surface of TEOS layer 32B on the wafer WA is exposed. In addition, as illustrated in FIG. 10F, second aSi (here, referred to as aSi layer 33A) is formed on the TEOS layer 32B.

Figure 11A:
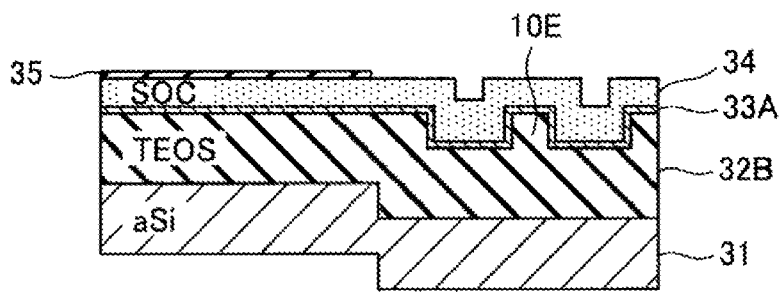
FIGS. 11A to 11D are views illustrating processing sequence (2) of the imprinting according to the fifth embodiment.

Furthermore, as illustrated in FIG. 11A, a SOC layer 34 which is an SOC film, a SOG layer 35 which is an SOG film, and an adhesion film (not illustrated) are formed on aSi layer 33A. SOC layer 34 is provided on approximately the entire surface on aSi layer 33A. A formation location range of SOG layer 35 is the same as the area of the element formation region 11.

Figure 11B:
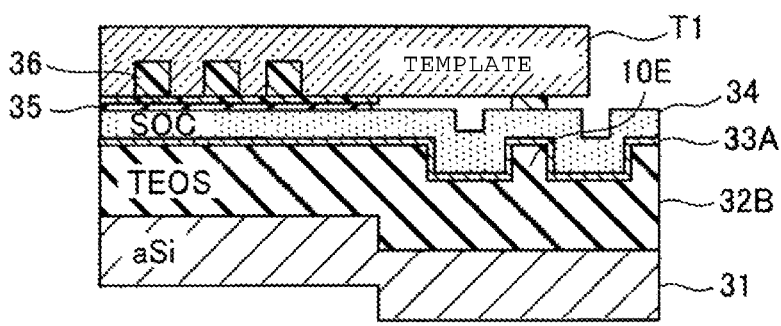

After the adhesion film is formed, an NIL pattern is formed. Specifically, as illustrated in FIG. 11B, the NIL resist 36 is dropped onto the auxiliary pattern 10B and the element formation region 11. With respect to the auxiliary pattern 10B, the NIL resist 36 is selectively dropped on a predetermined region of the auxiliary pattern 10B. At this time, the NIL resist 36 with a thickness corresponding to RLT is dropped on the predetermined region of the auxiliary pattern 10B.

A position on which the NIL resist 36 is dropped on the auxiliary pattern 10B is, for example, a region which is not required for a device operation. For example, the position on which the NIL resist 36 is dropped is a position in which the pattern of the template T1 does not come into contact with the NIL resist 36 when stamping is performed on the template T1. Thereby, even when the NIL resist 36 remains in the auxiliary pattern 10B, the resist does not affect the device operation. Even though an alignment mark or the like is previously formed on a lower layer than TEOS layer 32B, when the alignment mark has been already used, the region may be set to a position on which the NIL resist 36 is dropped.

After the NIL resist 36 is dropped, the template T1 comes into contact with the NIL resist 36. In this case, because the auxiliary pattern 10E is formed in the wafer WA, it is possible to prevent the template T1 from bending downward and coming into contact with the wafer WA in the peripheral region 15. As a result, alignment accuracy between the wafer WA and the template T1 is increased, and desirable element performance can be obtained.

Once the template T1 presses the NIL resist 36 and the pattern of the template T1 is filled with the NIL resist 36, the NIL resist 36 is cured. In this manner, when the NIL resist 36 is formed on the auxiliary pattern 10E, that NIL resist 36 is also cured. Meanwhile, when a contact area between the template T1 and the wafer WA may be reduced, the NIL resist 36 need not be formed on the auxiliary pattern 10E. In this case, a position in which the auxiliary pattern 10E is formed is a position in which the patterned portion of the template T1 does not come into contact when stamping is performed by the template T1. Thereby, even when the template T1 comes into contact with the auxiliary pattern 10E, the contact does not affect the device operation.

After the NIL resist 36 is cured, the template T1 is separated from the NIL resist 36. Thereafter, the NIL resist 36 and the adhesion film on the auxiliary pattern region 16 are removed. In addition, SOG layer 35 is then dry-etched using the NIL resist 36 pattern on the element formation region 11 as a processing mask. At this time, dry etching conditions (etching gas) are appropriately selected from mixed gases of halogenated carbon, hydrogen halides, halogenated hydrocarbons, hydrogen, and the like. In an SOG processing step, a thickness of the SOC layer 34 is further reduced below that of the element formation region 11, in a region (the peripheral region 15 or the like) where SOG layer 35 need not be present, particularly in the auxiliary pattern region 16.

On the wafer WA, the SOG pattern is formed by dry-etching SOG layer 35. SOC layer 34 is thus processed using the SOG pattern as a processing mask, whereby the SOC pattern is formed. Oxygen-based gas is mainly used for processing of SOC layer 34.

Figure 11C:
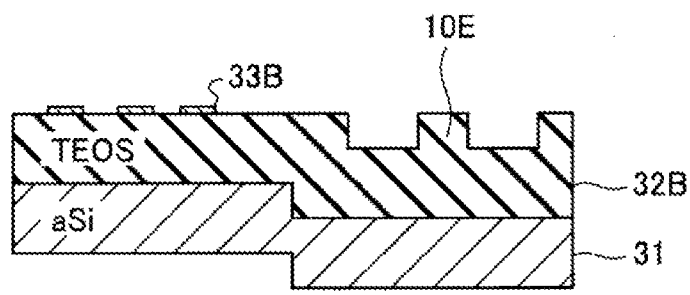

Furthermore, aSi layer 33A is processed using the SOC pattern as a processing mask. When aSi layer 33A is processed, dry etching conditions with high processing resistance are used for TEOS layer 32B. In addition, after the aSi layer 33A is processed, the patterned SOC layer 34 is removed with the oxygen-based gas. At this time, appropriate removal conditions are used, and thus, it is possible to remove the aSi layer 33A of the auxiliary pattern region 16, in this step. Thereby, as illustrated in FIG. 11C, only aSi (aSi processing pattern 33B) in the element formation region 11 remains on TEOS layer 32B. The aSi processing pattern 33B is formed in the same position as the NIL resist 36 pattern on the element formation region 11.

Figure 11D:
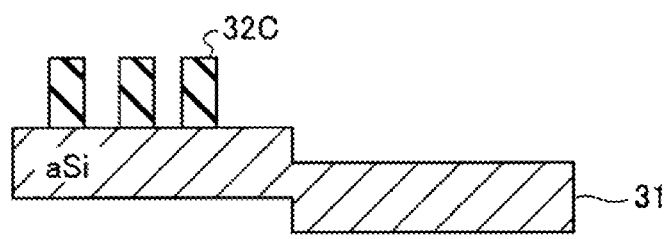

Thereafter, TEOS layer 32B is processed using the aSi processing pattern 33B as a processing mask. Thereby, as illustrated in FIG. 11D, TEOS layer 32B becomes a TEOS processing pattern 32C. The TEOS processing pattern 32C is formed in the same position as the aSi processing pattern 33B. When the TEOS processing pattern 32C is formed, appropriate processing conditions are selected, and thus, the auxiliary pattern 10E can be removed in a step of forming the TEOS processing pattern 32C. The auxiliary pattern 10E may be removed in a step subsequent to that.

However, when the height H1 of the initial step difference is higher than a predetermined value, the auxiliary pattern 10E can remain in a step of forming the TEOS processing pattern 32C. An example which solves the problem in this case will be described.

Specifically, instead of TEOS layer 32A, a first TEOS layer and a second TEOS layer are used. The first TEOS layer has a desirable thickness which is initially set, and the second TEOS layer has a thickness of the height H1. Thereby, a film in which the first TEOS layer and the second TEOS layer are stacked has the same thickness as TEOS layer 32A. In addition, a film with relatively lower etch processing resistance than the first TEOS layer is used for the second TEOS layer, when the film is processed.

When the second TEOS layer is formed, a film formation temperature is lower than that when the first TEOS layer is formed. Thereby, the presence of a Si—H bond or dangling bond of Si in the second TEOS layer is greater than that in the first TEOS layer. As a result, an upper portion of the TEOS layer processing pattern 32C as the auxiliary pattern 10E is easily removed, and the auxiliary pattern 10E is easily removed in a predetermined process.

A type of film, a combination of films, and processing conditions according to the present embodiment are just are an example, and can be appropriately changed depending on a structure of elements to be fabricated and a layer. For example, aSi layer 33A which is a second amorphous silicon film may be a polysilicon film, a metal film such as tungsten (W), a SiN film, or the like. In addition, TEOS layer 32A may be other oxide films such as a BSG film. In addition, in the same manner, the etching conditions are not limited to dry etching. In addition, after the dry etching is performed, appropriate cleaning, wet etching, or the like may be added.

In this manner, according to the fifth embodiment, the auxiliary pattern 10E can be formed using a film which is previously formed on the wafer WA. In addition, by using the auxiliary pattern 10E, alignment accuracy between the template T1 and the wafer WA can be increased.

(Sixth Embodiment)

Next, a sixth embodiment will be described with reference to FIG. 12A to FIG. 13E. In the sixth embodiment, sacrificial TEOS which is the second TEOS layer is formed after a film formation process of the second aSi, in addition to processing described in the fifth embodiment. In addition, CMP for sacrificial TEOS is performed, and thereafter, the sacrificial TEOS is removed. In the present embodiment, processing of a case where position displacement on the element formation region 11 side occurs in the exposing at the time of forming an auxiliary pattern will be described.

FIGS. 12A to 12E are views illustrating processing sequence (1) of imprinting according to the sixth embodiment. In addition, FIGS. 13A to 13E are views illustrating processing sequence (2) of the imprinting according to the sixth embodiment. In each processing of FIG. 12A to FIG. 13E, the same processing as that described in FIG. 10A to FIG. 11D will be omitted to avoid repetition.

FIG. 12A to FIG. 13E illustrate sectional views of the wafer WA or the like in the imprinting process. In FIG. 12A to FIG. 13E, a film on a lower layer side than the first amorphous silicon film (aSi31) on the wafer WA is not illustrated. In addition, in FIG. 12A to FIG. 13E, a step difference between the element formation region 11 and the peripheral region 15 is schematically illustrated.

As described with reference to FIG. 10A, there is a case where an initial step difference with the height H1 is generated in the peripheral portion of the wafer WA, at a point of time when the aSi layer 31 is formed on the wafer WA. In this case, TEOS layer 32Ax is formed on aSi layer 31. TEOS layer 32Ax is the same film layer as TEOS layer 32A illustrated in FIG. 10B.

Figure 12A:
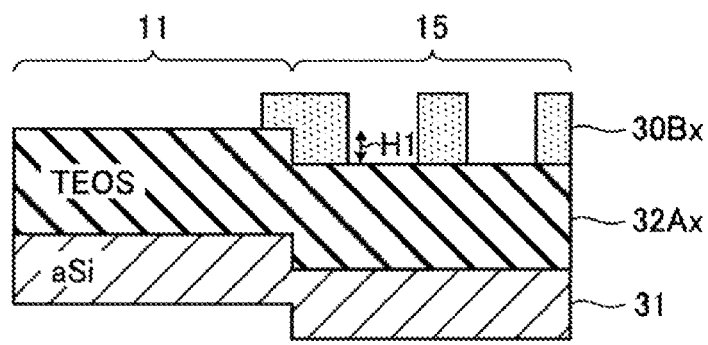
FIGS. 12A to 12E are views illustrating processing sequence (1) of imprinting according to a sixth embodiment.

Thereafter, as illustrated in FIG. 12A, a processing mask (resist pattern) 30Bx is formed in the auxiliary pattern region 16 of the wafer WA in which TEOS layer 32Ax is formed. The processing mask 30Bx has the same pattern as the processing mask 30A illustrated in FIG. 10C, but position displacement occurs in the processing mask 30Bx. Specifically, in the processing mask 30Bx, a portion thereof is displaced in the direction of the element formation region 11.

Figure 12B:
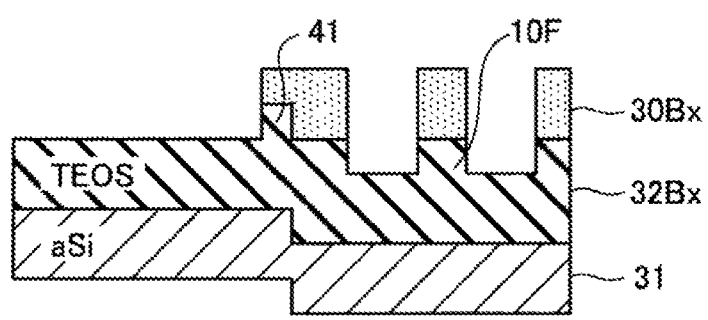

In this state, when the processing mask 30Bx is transferred to the TEOS layer 32Ax, an auxiliary pattern 10F is formed and an angular structure (convex portion 41) is generated in the element formation region 11, as illustrated in FIG. 12B. The auxiliary pattern 10F is otherwise the same as the auxiliary pattern 10E. The convex portion 41 is formed near a boundary between the element formation region 11 and the auxiliary pattern region 16.

Figure 12C:
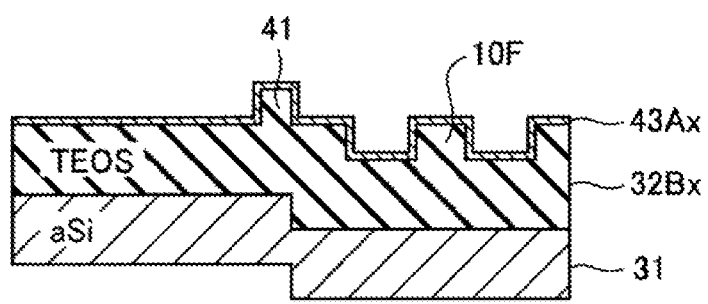

Thereafter, the processing mask 30Bx is removed from the wafer WA. Thereby, TEOS layer 32Bx is exposed in the entire surface on the wafer WA. In addition, as illustrated in FIG. 12C, a third aSi film (here, aSi layer 43Ax) is formed on TEOS layer 32Bx.

Figure 12D:
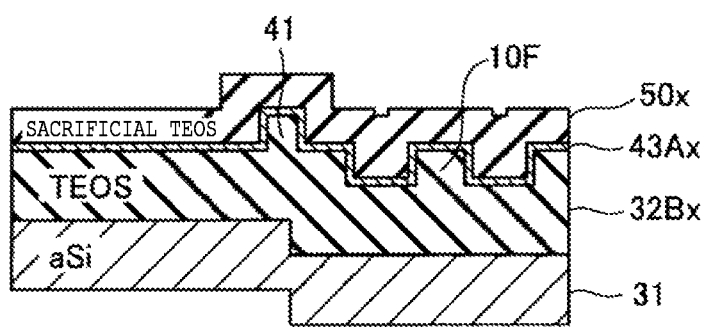

Furthermore, as illustrated in FIG. 12D, sacrificial TEOS layer 50x is formed on aSi layer 43Ax. Thereafter, chemical mechanical polishing (CMP) is performed on the sacrificial TEOS layer 50x, whereby an uppermost surface of the layers on the wafer WA is planarized.

Figure 12E:
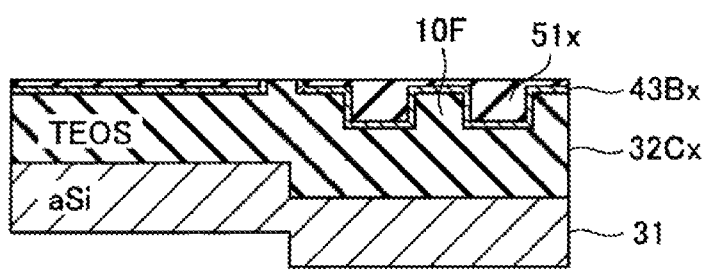

Thereby, as illustrated in FIG. 12E, aSi layer 43Ax and TEOS layer 32Bx which configure the convex portion 41 are removed to extend the same height as the sacrificial TEOS layer 51x. After CMP, an uppermost surface of the aSi layer 43Bx and an uppermost surface of TEOS layer 32Cx in the convex portion 41 are exposed in an uppermost surface other than where sacrificial TEOS layer 51x is exposed. It is a first requirement that the amount of CMP of the sacrificial TEOS layer 50x is set such that the aSi layer 43Bx is not removed over.

Figure 13A:
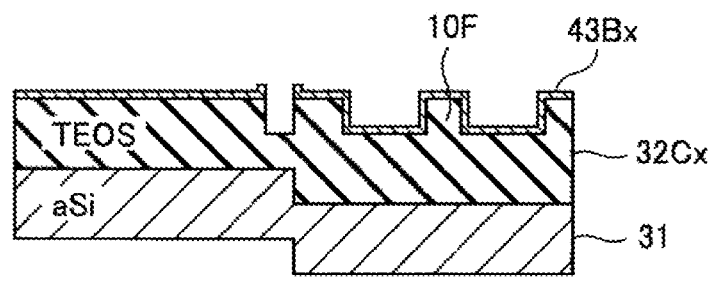
FIGS. 13A to 13E are views illustrating processing sequence (2) of the imprinting according to the sixth embodiment.

Thereafter, the entire surface of the wafer WA is etched, and the sacrificial TEOS layer 51x is removed. Specifically, it is preferable that the sacrificial TEOS layer 51x is dissolved, but aSi layer 43Bx is not dissolved, wet etching is performed by DHF, and cleaning is performed using pure water. As a result, as illustrated in FIG. 13A, the sacrificial TEOS layer 51x is removed. In addition, in TEOS layer 32Cx, a lower side portion of the convex portion 41 in which aSi layer 43Bx is not provided is etched.

A convex structure of the aSi layer 43Bx corresponding to a thickness of the sacrificial TEOS51x remains on the outer surfaces of the convex portion 41, after CMP. Planarizing the SOC film during coating is a second requirement for setting the amount of the sacrificial TEOS layer 50x removed during CMP.

Figure 13B:
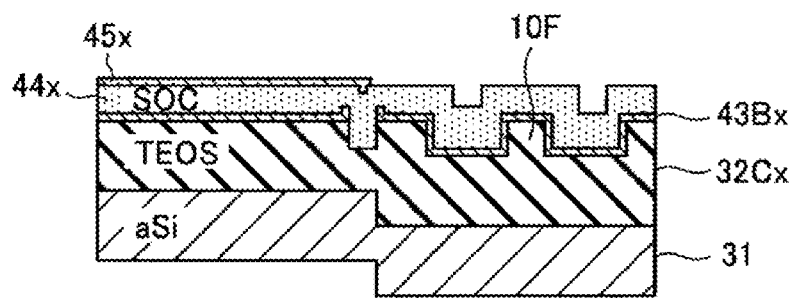

In addition, as illustrated in FIG. 13B, SOC layer 44x which is an SOC film, SOG layer 45x which is an SOG film, and an adhesion film (not illustrated) are formed on aSi layer 43Bx. SOC layer 44x is formed on approximately the entire surface of aSi layer 43Bx. The formation area of the SOG layer 45x is the same as the area of the element formation region 11.

Figure 13C:
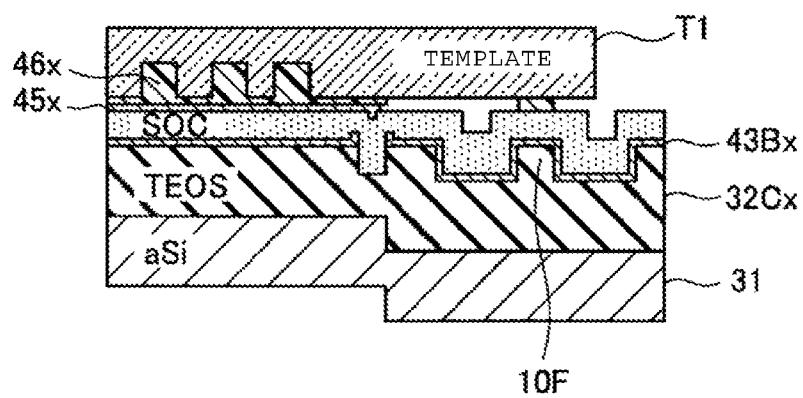

Thereafter, in the same manner as the processing described with reference to FIG. 11B, a NIL resist 46x is dropped on an upper layer side of the auxiliary pattern 10F and the element formation region 11. In addition, as illustrated in FIG. 13C, the template T1 presses the NIL resist 46x, and the pattern of the template T1 is filled with the NIL resist 46x. In this state, the NIL resist 46x is cured. In addition, the template T1 is separated from the NIL resist 46x.

Furthermore, the NIL resist 46x and the adhesion film on the auxiliary pattern region 16 are removed. In addition, SOG layer 45x is dry-etched using the NIL resist 46x (convex portion of the resist pattern) on the element formation region 11 as a processing mask. Thereby, an SOG pattern is formed. SOC layer 44x is processed using the SOG pattern as a processing mask. Thereby, an SOC pattern is formed.

In addition, aSi layer 43Bx is processed using the SOC pattern as a processing mask. SOG layer 45x, SOC layer 44x, and aSi layer 43Bx are formed by the same processing as of SOG35, SOC34, and aSi processing pattern 33B which are described in the fifth embodiment.

Figure 13D:
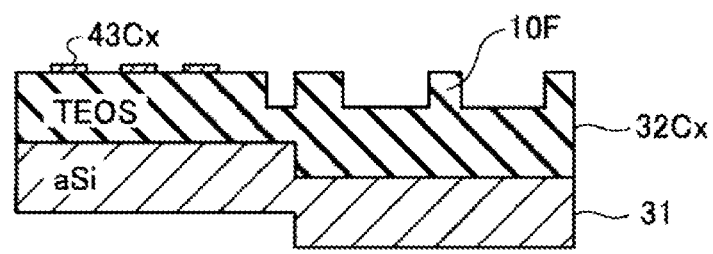

Thereby, as illustrated in FIG. 13D, only aSi (aSi processing pattern 43Cx) of the element formation region 11 remains on TEOS layer 32Cx. The aSi processing pattern 43Cx is the same as the aSi processing pattern 33B.

Figure 13E:
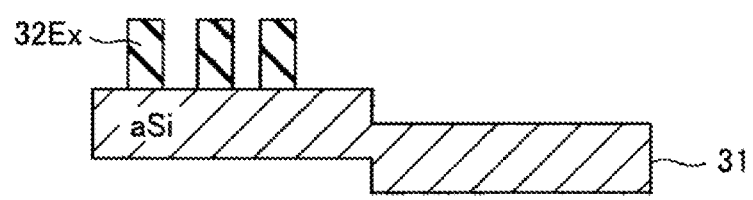

Thereafter, TEOS layer 32Cx is processed using the aSi processing pattern 43Cx as a processing mask. TEOS layer 32Cx is processed by the same processing as used to process TEOS layer 32B described in the fifth embodiment. Thereby, as illustrated in FIG. 13E, TEOS layer 32Cx becomes a TEOS processing pattern 32Ex. The TEOS processing pattern 32Ex is the same as the TEOS processing pattern 32C.

In the present embodiment, a case where CMP is performed on the sacrificial TEOS layer 50x is described, but CMP may be performed on aSi layer 43Ax without forming the sacrificial TEOS50x.

In this manner, according to the sixth embodiment, the wafer WA is planarized using the sacrificial TEOS layer 50x, and thus, it is possible to prevent an unnecessary roughness pattern from being formed, even when position displacement occurs on the element formation region 11 side in the exposing when the auxiliary pattern 10F is formed. In addition, even when the auxiliary pattern formation methods described in the first, third, or fourth embodiment is applied to the sixth embodiment, the same effects as those of the sixth embodiment are obtained.

(Seventh Embodiment)

Next, a seventh embodiment will be described with reference to FIG. 14A to FIG. 15E. In the seventh embodiment, the same processing as in the sixth embodiment is performed. In the present embodiment, a case where position displacement occurs on the pattern in the auxiliary pattern region 16 when an auxiliary pattern is formed will be described.

FIGS. 14A to 14E are views illustrating processing sequence (1) of imprinting according to a seventh embodiment. In addition, FIGS. 15A to 15E are views illustrating processing sequence (2) of the imprinting according to the seventh embodiment. In each processing of FIG. 14A to FIG. 15E, the same processing as that described in FIG. 12A to FIG. 14E will be omitted to avoid repetition.

FIG. 14A to FIG. 15E illustrate sectional views of the wafer WA or the like in the imprinting process. In FIG. 14A to FIG. 15E, a film on a lower layer side than the first amorphous silicon film (aSi layer 31) on the wafer WA is not illustrated. In addition, in FIG. 14A to FIG. 15E, a step difference between the element formation region 11 and the peripheral region 15 is schematically illustrated.

As described with reference to FIG. 10A, there is a case where an initial step difference with the height H1 is generated in the peripheral portion of the wafer WA, at a point of time when aSi layer 31 is formed on the wafer WA. In this case, TEOS layer 32Ay is formed on aSi layer 31. TEOS layer 32Ay is the same film as TEOS layer 32A illustrated in FIG. 10B.

Figure 14A:
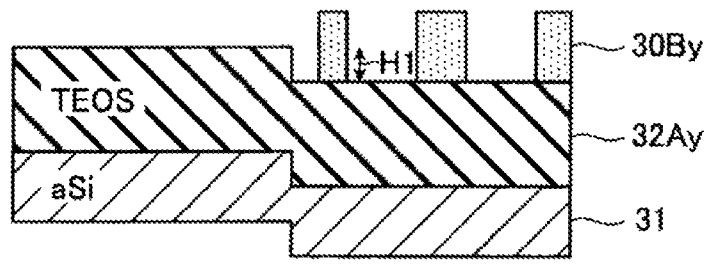
FIGS. 14A to 14E are views illustrating processing sequence (1) of imprinting according to a seventh embodiment.

Thereafter, as illustrated in FIG. 14A, a processing mask (resist pattern) 30By is formed in the auxiliary pattern region 16 of the wafer WA in which TEOS layer 32Ay is formed. The processing mask 30By has the same pattern as the processing mask 30A illustrated in FIG. 10C, but displacement has occurred in the position of processing mask 30By.

Specifically, in the processing mask 30By, a formation position is displaced in the direction of the auxiliary pattern region 16 side.

Figure 14B:
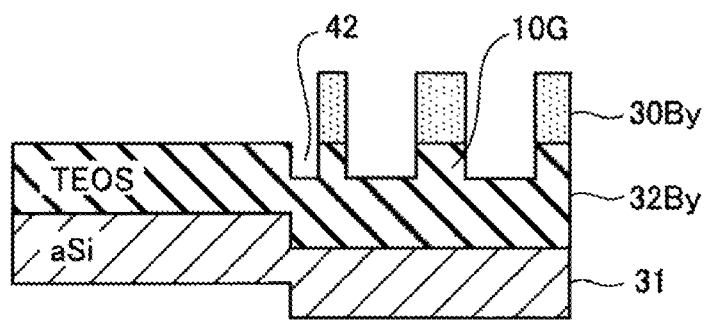

In this state, when the processing mask 30By is transferred to TEOS layer 32Ay, an auxiliary pattern 10G is formed and a recess structure (the concave portion 42) is generated in the auxiliary pattern region 16, as illustrated in FIG. 14B. The concave portion 42 is formed near a boundary between the element formation region 11 and the auxiliary pattern region 16. The auxiliary pattern 10G is the same as the auxiliary patterns 10E and 10F.

Figure 14C:
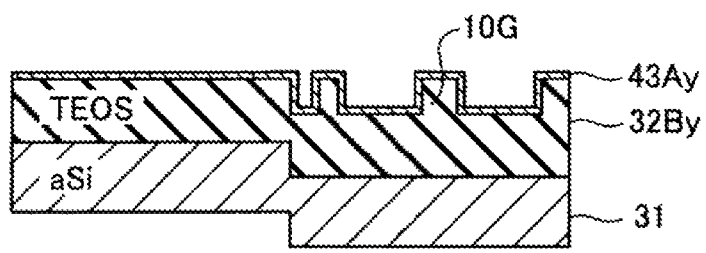

Thereafter, the processing mask 30By is removed from the wafer WA. Thereby, TEOS layer 32By is exposed on the entire surface on the wafer WA. In addition, as illustrated in FIG. 14C, a fourth amorphous silicon film (hereinafter, referred to as aSi layer 43Ay) is formed on TEOS layer 32By.

Figure 14D:
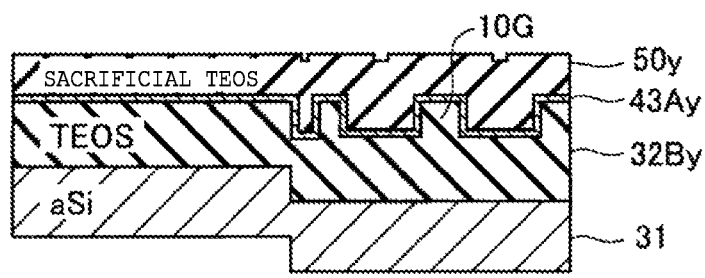

Furthermore, as illustrated in FIG. 14D, sacrificial TEOS layer 50y is formed on aSi layer 43Ay. Thereafter, CMP is performed to the sacrificial TEOS layer 50y, whereby an uppermost surface of the wafer WA is planarized.

Figure 14E:
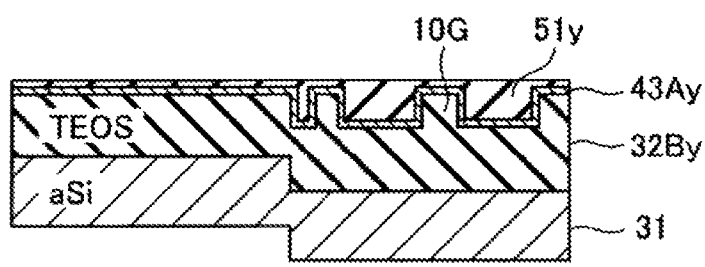

Thereby, as illustrated in FIG. 14E, an uppermost surface of the planarized TEOS layer 51y is exposed on an uppermost surface of the wafer WA. It is a requirement that the amount of CMP of the sacrificial TEOS layer 51y is set such that aSi layer 43Ay is not removed.

Figure 15A:
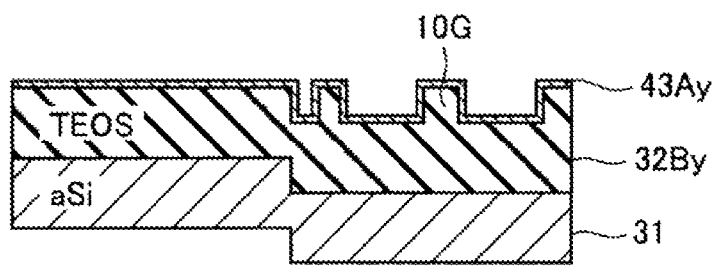
FIGS. 15A to 15E are views illustrating processing sequence (2) of the imprinting according to the seventh embodiment.

Thereafter, the entire surface of the wafer WA is etched, and the sacrificial TEOS layer 51y is removed. Specifically, it is preferable that the sacrificial TEOS layer 51y is dissolved, but aSi layer 43Ay is not dissolved, wet etching is performed by DHF, and cleaning is performed using pure water. As a result, as illustrated in FIG. 15A, the sacrificial TEOS layer 51y is removed. In addition, aSi layer 43Ay remains in the element formation region 11. Thereby, aSi layer 43Ay is exposed in the element formation region 11 and the auxiliary pattern region 16.

Figure 15B:
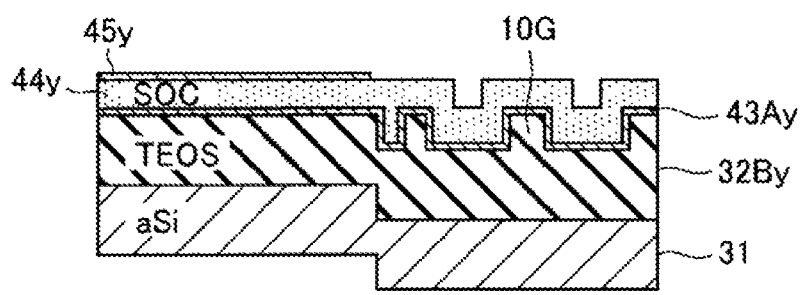

In addition, as illustrated in FIG. 15B, SOC layer 44y, SOG layer 45y, and an adhesion film (not illustrated) are formed on aSi layer 43Ay. SOC layer 44y and SOG layer 45y are respectively the same film layers as SOC layer 44x and SOG layer 45x.

Figure 15C:
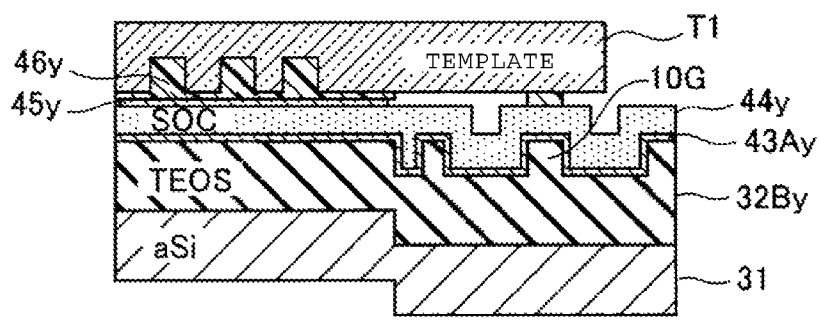

Thereafter, in the same manner as the processing described with reference to FIG. 11B, an NIL resist 46y is dropped on an upper layer side of the auxiliary pattern 10G and the element formation region 11. In addition, as illustrated in FIG. 15C, the template T1 presses into the NIL resist 46y, and the pattern of the template T1 is filled with the NIL resist 46y. In this state, the NIL resist 46y is cured. In addition, the template T1 is separated from the NIL resist 46y.

Furthermore, the NIL resist 46y and the adhesion film on the auxiliary pattern region 16 are removed. In addition, SOG layer 45y, SOC layer 44y, and aSi layer 43Ay are processed by the processing which is the same as the processing of SOG layer 35, SOC layer 34, and the aSi processing pattern 33A which are described in the fifth embodiment.

Figure 15D:
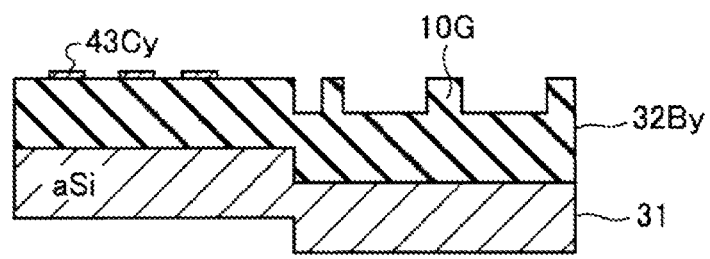

Thereby, as illustrated in FIG. 15D, only aSi (aSi processing pattern 43Cy) of the element formation region 11 remains on TEOS layer 32By. The aSi processing pattern 43Cy is the same as the aSi processing pattern 33B.

Figure 15E:
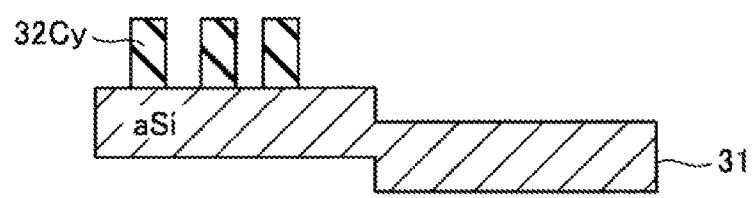

Thereafter, TEOS layer 32By is processed using the aSi processing pattern 43Cy as a processing mask. TEOS layer 32By is processed using the same processing as used on TEOS layer 32 described in the fifth embodiment. Thereby, as illustrated in FIG. 15E, TEOS layer 32By becomes a TEOS processing pattern 32Cy. The TEOS processing pattern 32Cy is the same as the TEOS processing pattern 32C. The concave portion 42 can be removed by performing the processing described in the fifth embodiment.

In this manner, according to the seventh embodiment, the wafer WA is planarized using the sacrificial TEOS layer 50y, and thus, it is possible to prevent an unnecessary roughness pattern from being formed, even when position displacement occurs on the auxiliary pattern region 16 side in the exposing when the auxiliary pattern 10G is formed. In addition, even when the auxiliary pattern formation methods described in the first, third, or fourth embodiment is applied to the seventh embodiment, the same effects as those of the seventh embodiment are obtained.

In the imprinting process, a template T1 which becomes curved by stamping can come into contact with a wafer in a peripheral region of the wafer, when the resist is stamped by the template T1. It is considered that the contact of the template T1 with the wafer can increase resistance against relative move of the template T1 with respect to the wafer. When alignment accuracy between the template T1 and the wafer does not achieve the required specification, there is a case where the fabricated element does not perform a desired operation. In addition, there is a possibility that unintended device contamination is produced in the fabrication process so that a fabrication facility or an element does not operate.

In the first to seventh embodiments, any one of the auxiliary patterns 10A to 10G is formed in the peripheral region 15, and thus, contact resistance between the template T1 and the wafer WA can be reduced. Hence, it is possible to increase the alignment accuracy between the template T1 and the wafer WA. In addition, since the template T1 does not collide with the wafer WA in the peripheral region 15, it is possible to prevent the template T1 from being damaged. The imprinting may be performed to the wafer WA by combining the processing described in the first to seventh embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imprint pattern forming method, comprising:
providing a substrate with a pattern formation region and a peripheral region, the peripheral region having a surface lower than a surface of the pattern formation region and located at a periphery of the pattern formation region;
forming an auxiliary pattern with a predetermined height on a portion of the peripheral region, a surface of the auxiliary pattern being substantially co-planar with the surface of the pattern formation region;
providing a resist layer on the pattern formation region; and
imprinting the resist layer using a template by locating the template in a region which includes a portion of the pattern formation region and a portion of the peripheral region.

2. The method according to claim 1, wherein the auxiliary pattern has an annular ring shape.

3. The method according to claim 1, wherein the auxiliary pattern is configured with multiple separated pattern elements.

4. The method according to claim 1, further comprising forming the auxiliary pattern using photolithographic processing.

5. The method according to claim 1, further comprising forming the auxiliary pattern using chemical solution coating.

6. The method according to claim 1, wherein the predetermined height of the auxiliary pattern is equal to a difference between a height of the surface of the pattern formation region and a height of the surface of the peripheral region from the substrate.

7. The method according to claim 1, wherein during the imprinting, the resist layer is located on the pattern formation region and an upper surface of the auxiliary pattern.

8. The method according to claim 7, wherein the resist layer is located on the auxiliary pattern in a position where a non-device pattern region of the template will contact the resist layer.

9. The method according to claim 1, wherein:
during imprinting, the resist layer is not located on a device pattern region of the auxiliary pattern, and
the template comes into contact with the resist layer in the pattern formation region.

10. The method according to claim 9, wherein the resist layer is located on the auxiliary pattern in a position where a device pattern region of the template contacts the resist layer.

11. The method according to claim 1, further comprising:
arranging a sacrificial film on the auxiliary pattern;
performing chemical mechanical polishing to the sacrificial film; and
removing the sacrificial film.

12. A method of imprint lithography, comprising:
providing a substrate having a central region on which one or more semiconductor devices will be formed, and a peripheral bevel region;
forming an auxiliary pattern on the peripheral bevel region such that an upper surface of the auxiliary pattern and the central region are substantially co-planar;
forming a resist layer on at least the central region;
providing a template having a patterned surface having a plurality of individual chip patterns thereon; and
moving at least one of the template and the substrate to form a pattern of the template in the resist layer,
wherein the template is positioned such that at least a portion of the template overlies the auxiliary pattern during the forming of the pattern of the template in the resist layer.

13. The method according to claim 12, wherein the portion of the template overlying the auxiliary pattern does not include a chip pattern thereon.

14. The method according to claim 13, wherein the auxiliary pattern is intermittently provided on the peripheral bevel region.

15. The method according to claim 13, wherein the auxiliary pattern comprises a plurality of spaced pillars.

16. The method according to claim 12, wherein the auxiliary pattern extends on the peripheral bevel region from the central region to an edge of the substrate.

17. The method according to claim 12, wherein the auxiliary pattern is spaced from a location where the peripheral bevel meets the central region.

18. The method according to claim 12, wherein the auxiliary pattern extends on the peripheral bevel region from the central region to a location inwardly of the edge of the substrate.

19. A method of imprint lithography, comprising:
providing a substrate having a first region having a first height and a second region adjacent to the first region, the second region surrounding the first region and having a second height lower than the first height;
forming a material layer on the second region, the material layer having an upper surface at the first height;
placing an imprint resist on the first region and the second region;
providing a template having a patterned surface having a plurality of individual chip patterns thereon;
positioning the template over the first region and the second region with the material layer formed thereon; and
moving at least one of the substrate and the template to cause the resist to flow into the patterned surface of the template, a portion of the resist being disposed on the upper surface of the material layer.

20. The method according to claim 19, wherein the material layer is selectively provided on the second region.

* * * * *